(12) United States Patent
Lee et al.

(10) Patent No.: US 11,087,648 B2
(45) Date of Patent: Aug. 10, 2021

(54) DISPLAY DEVICE

(71) Applicant: LG Display Co., Ltd., Seoul (KR)

(72) Inventors: YoungShin Lee, Paju-si (KR);
ChounSung Kang, Gimpo-si (KR);
Mi-Na Shin, Paju-si (KR); SunBok Song, Paju-si (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/033,789

(22) Filed: Sep. 26, 2020

(65) Prior Publication Data

US 2021/0012688 A1  Jan. 14, 2021

Related U.S. Application Data

(63) Continuation of application No. 16/567,404, filed on Sep. 11, 2019, now Pat. No. 10,847,066.

(30) Foreign Application Priority Data

Sep. 17, 2018  (KR) .................. 10-2018-0111104

(51) Int. Cl.
*G09F 9/30* (2006.01)
*H05K 5/03* (2006.01)
(Continued)

(52) U.S. Cl.
CPC ............ *G09F 9/301* (2013.01); *G06F 1/1652* (2013.01); *H05K 1/147* (2013.01); *H05K 1/189* (2013.01);
(Continued)

(58) Field of Classification Search
CPC ....... G09F 9/301; G06F 1/1652; H05K 1/147; H05K 1/189; H05K 5/03;
(Continued)

(56) References Cited

U.S. PATENT DOCUMENTS 9,756,757 B2   9/2017  Park et al.
10,111,344 B2  10/2018 Han et al.
(Continued)

FOREIGN PATENT DOCUMENTS

CN       1550830 A    12/2004
CN     102651184 A     8/2012
(Continued)

OTHER PUBLICATIONS

Combined Search and Examination Report dated Nov. 27, 2020 from the UKIPO concerning the counterpart UK Application No. GB2010006.1.
(Continued)

*Primary Examiner* — Christopher E Mahoney
(74) *Attorney, Agent, or Firm* — Morgan, Lewis & Bockius LLP

(57) ABSTRACT

A disclosed display device may include a display panel including a plurality of sub-pixels, and a back cover configured to support the display panel and configured be wound or unwound along with the display panel. The display device may further include a base plate on a first surface of the back cover to support the back cover and a top cover on a second surface of the back cover opposite the first surface so that the back cover is between the base plate and the top cover. The top cover may be fixed to the back cover. The top cover may have a curved outer peripheral surface.

17 Claims, 25 Drawing Sheets

(51) Int. Cl.
*H05K 1/18* (2006.01)
*G06F 1/16* (2006.01)
*H05K 5/00* (2006.01)
*H05K 1/14* (2006.01)
*H05K 5/02* (2006.01)

(52) U.S. Cl.
CPC ......... *H05K 5/0017* (2013.01); *H05K 5/0217* (2013.01); *H05K 5/03* (2013.01); *H05K 2201/10128* (2013.01)

(58) Field of Classification Search
CPC ......... H05K 2201/10128; H05K 5/017; H05K 5/0217; H05K 5/0017
See application file for complete search history.

(56) References Cited

U.S. PATENT DOCUMENTS

| | | |
|---|---|---|
| 10,257,945 B2 | 4/2019 | Kim et al. |
| 2004/0121824 A1 | 6/2004 | Lee |
| 2004/0233372 A1 | 11/2004 | Park et al. |
| 2004/0257515 A1 | 12/2004 | Lee |
| 2006/0107566 A1 | 5/2006 | Van Rens |
| 2008/0049003 A1 | 2/2008 | Hasegawa |
| 2010/0079942 A1 | 4/2010 | Yamamoto et al. |
| 2016/0029474 A1 | 1/2016 | Cho et al. |
| 2016/0186944 A1 | 6/2016 | Park et al. |
| 2016/0205791 A1 | 7/2016 | Kim et al. |
| 2016/0374228 A1 | 12/2016 | Park et al. |
| 2017/0013726 A1 | 1/2017 | Han et al. |
| 2017/0031388 A1 | 2/2017 | Han et al. |
| 2017/0318688 A1 | 11/2017 | Kim et al. |
| 2018/0070467 A1* | 3/2018 | Kim ................ G06F 1/1652 |
| 2018/0153049 A1 | 5/2018 | Song et al. |

FOREIGN PATENT DOCUMENTS

| | | |
|---|---|---|
| CN | 105739169 A | 7/2016 |
| CN | 106340254 A | 1/2017 |
| CN | 107342018 A1 | 11/2017 |
| CN | 108122490 A | 6/2018 |
| EP | 3173855 A1 | 5/2017 |
| JP | 2006509249 A | 3/2006 |
| JP | 2008052040 A | 3/2008 |
| JP | 2010081280 A | 4/2010 |
| JP | 2012043613 A | 3/2012 |
| JP | 2016122206 A | 7/2016 |
| JP | 2016130853 A | 7/2016 |
| JP | 2017198968 A | 11/2017 |
| JP | 2018092150 A | 6/2018 |
| KR | 10-0906961 B1 | 7/2009 |
| KR | 10-2017-0006013 A | 1/2017 |
| TW | 201701246 A | 1/2017 |

OTHER PUBLICATIONS

Notice of Reasons for Refusal dated Sep. 29, 2020, issued in corresponding Japanese Patent Application No. 2019-165815.
First Office Action and Search Report dated Jul. 6, 2020 issued by the TIPO in a corresponding counterpart TW Application No. 108131943 (partial English translation submitted in the parent application).
Combined Search and Examination Report from the UKIPO dated Jan. 16, 2020 in connection with the counterpart UK Application No. GB1913396.6.
The First Office Action dated Apr. 23, 2021, issued in corresponding Chinese Patent Application No. 201910875263.X.

* cited by examiner

FM(FM1,FM2)

DISPLAY DEVICE

CROSS-REFERENCE TO RELATED APPLICATIONS

This application is a continuation of U.S. patent application Ser. No. 16/567,404, filed on Sep. 11, 2019, which claims the benefit and priority of Korean Patent Application No. 10-2018-0111104 filed on Sep. 17, 2018, in the Korean Intellectual Property Office. All of the above prior U.S. and Korean Patent Applications are incorporated herein by reference as if fully set forth herein.

BACKGROUND

1. Technical Field

The present disclosure relates to a display device, and more particularly, to a rollable display device capable of displaying images even in a rolled state.

2. Description of the Related Art

Display devices used for a computer monitor, a TV, a mobile phone, and other applications include, among others, an organic light-emitting display (OLED) that emits light by itself and a liquid-crystal display (LCD) that requires a separate light source.

As display devices are applied to increasingly diverse fields, such as a computer monitor, a TV, and a personal mobile device, display devices having a large display area and a reduced volume and weight have been studied.

Recently, a rollable display device in which a display part and wiring lines are formed on a flexible substrate made of flexible plastic and which can display an image even in a rolled state has attracted attention as a next-generation display device.

SUMMARY

An object of the present disclosure is to provide a display device in which a flexible film and a printed circuit board may be securely fixed to minimize or suppress potential damages to a driver IC due to being shaken during winding of the display device.

Another object of the present disclosure is to provide a display device that can minimize or suppress potential damages to a driver IC that may be caused by a back cover during winding of the display device.

Yet another object of the present disclosure is to provide a display device that can minimize or suppress deformation of a display panel by a printed circuit board during winding and unwinding of the display device.

Still another object of the present disclosure is to provide a display device that can minimize or suppress separation of a display panel from a back cover during winding and unwinding of the display device.

Objects of the present disclosure are not limited to the examples noted above, and other objects may be apparent to or understood by those skilled in the art from the present disclosure, including the detailed description and drawings.

To achieve these and other advantages and in accordance with the purpose of the present disclosure, as embodied and broadly described, a display device may include: a display panel including a plurality of sub-pixels; a back cover configured to support the display panel and configured be wound or unwound along with the display panel; a base plate on a first surface of the back cover to support the back cover; and a top cover on a second surface of the back cover opposite the first surface so that the back cover is between the base plate and the top cover, the top cover being fixed to the back cover, wherein the top cover has a curved outer peripheral surface.

According to another aspect of the present disclosure, a display device may include: a display panel configured to display an image; a back cover disposed under the display panel and including a fixing area in which a plurality of fixing holes is disposed; a printed circuit board connected electrically to the display panel and disposed on the fixing area of the back cover; a base plate under the fixing area of the back cover; and a top cover on the printed circuit board on the fixing area of the back cover, wherein the base plate and the top cover are coupled to the back cover via the plurality of fixing holes.

Other details of example embodiments are included in the detailed description and the drawings.

According to the present disclosure, a printed circuit board and a flexible film may be disposed between a base plate and a top cover. Thus, it is possible to minimize or suppress potential damages to a driver IC due to impacts and vibration during winding or unwinding of a display device.

According to the present disclosure, the top cover may be disposed to protect the driver IC. Thus, it is possible to minimize or suppress potential damages to the driver IC by the top cover during winding of the display device.

According to the present disclosure, the top cover may have a curved surface. Thus, it is possible to minimize or suppress deformation of a display panel and a back cover by a roller during winding or unwinding of the display device.

According to the present disclosure, the top cover may have a curved surface. Thus, it is possible to minimize or suppress separation of the display panel from the back cover that may be caused by stress when the display device is rolled up.

According to the present disclosure, a pad may be disposed in a contact portion between the top cover and the display panel. Thus, it is possible to fix the display panel securely.

The potential benefits and advantages according to the present disclosure are not limited to the examples listed above, and various additional benefits and advantages may be discussed in or apparent from the present disclosure.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1A:
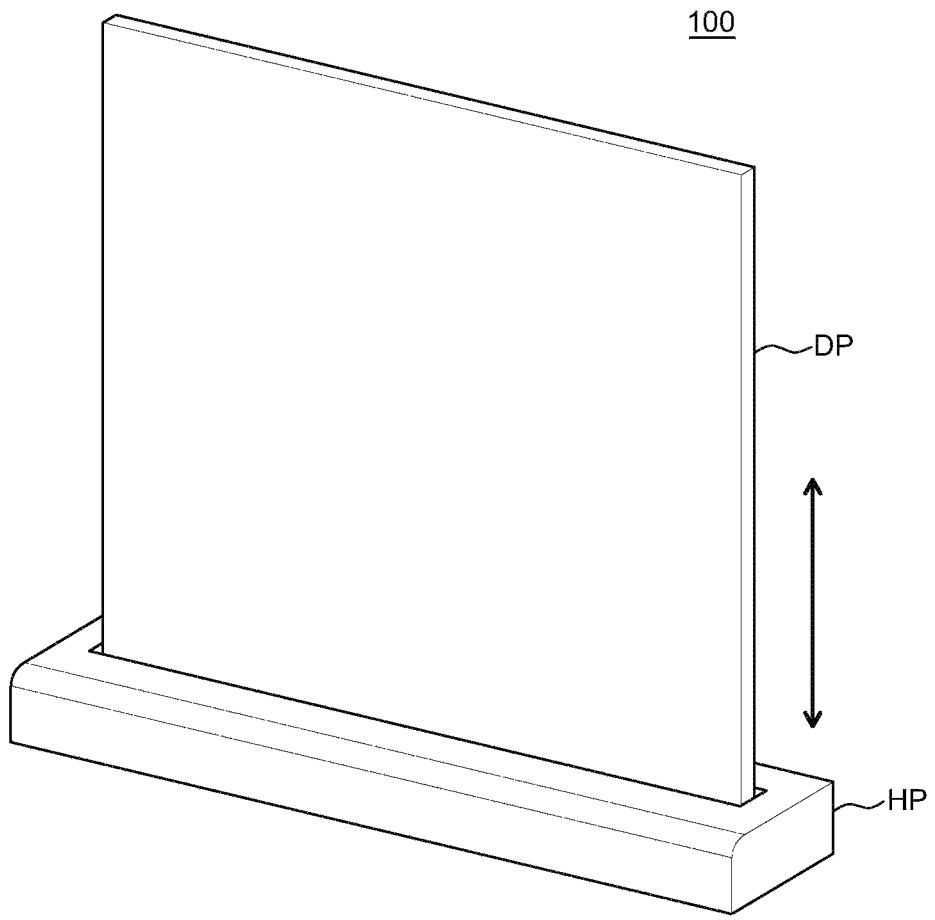
FIG. 1A and FIG. 1B are perspective views of a display device according to an example embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to obscure an important point of the present disclosure unnecessarily, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range is provided.

In describing a position relationship, when a position relation between two parts is described as, for example, "on," "over," "under," or "next," one or more other parts may be disposed between the two parts unless a more limiting term, such as "immediate(ly)" or "direct(ly)," is used. For example, when an element or layer is disposed "on" another element or layer, a third layer or element may be interposed therebetween.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

A size and a thickness of each component illustrated in the drawings are illustrated for convenience of description, and the present disclosure is not limited to the size and the thickness of the component illustrated, unless otherwise stated.

Features of various embodiments of the present disclosure may be partially or overall coupled to or combined with each other, and may be variously inter-operated with each other and driven technically, as those skilled in the art can sufficiently understand. Embodiments of the present disclosure may be carried out independently from each other, or may be carried out in association with each other.

Hereinafter, a display device according to example embodiments of the present disclosure will be described in detail with reference to accompanying drawings.

<Display Device—Rollable Display Device>

A rollable display device may refer to a display device which can display an image even in a rolled state. The rollable display device may have higher flexibility than conventional typical display devices. Depending on whether the rollable display device is in use, a shape of the rollable display device may be freely varied. Specifically, when the rollable display device is not in use, the rollable display device may be rolled to be stored with a reduced volume. On the other hand, when the rollable display device is in use, the rolled rollable display device may be unrolled to be used, e.g., to display images.

Figure 1B:
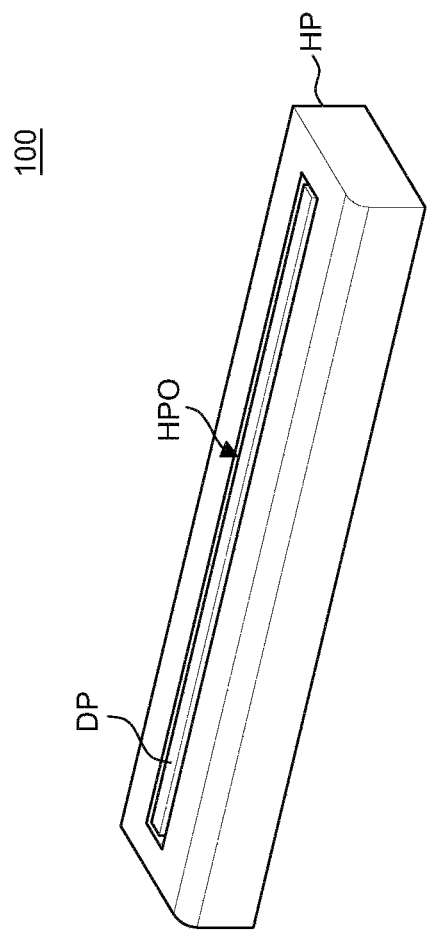

FIG. 1A and FIG. 1B are perspective views of a display device according to an example embodiment of the present disclosure. As shown in FIG. 1A and FIG. 1B, a display device 100 according to an example embodiment of the present disclosure includes a display part DP and a housing part HP.

The display part DP is configured to display images to a user. For example, display elements, circuits for driving the display elements, lines, and other components may be disposed in the display part DP. The display device 100 here according to an example embodiment of the present disclosure is a rollable display device 100. Therefore, the display part DP may be configured to be wound and unwound. For example, the display part DP may include a display panel and a back cover which are flexible so as to be capable of being wound or unwound. The display part DP will be described below in more detail with reference to FIGS. 5 through 7B.

The housing part HP serves as a case where the display part DP can be housed. The display part DP may be wound and housed inside the housing part HP, for example, as shown in FIG. 1B. Also, the display part DP may be unwound and presented outside the housing part HP, for example, as shown in FIG. 1A.

The housing part HP may include an opening HPO through which the display part DP can move in and out of the housing part HP. The display part DP can move up and down through the opening HPO of the housing part HP.

The display part DP of the display device 100 may be converted from a fully unwound state to a fully wound state, and vice versa.

FIG. 1A shows a fully unwound state of the display part DP of the display device 100. The fully unwound state refers to a state in which the display part DP of the display device 100 is presented outside the housing part HP. That is, the fully unwound state can be viewed as a state in which the display part DP is unwound to a maximum extent so as not to be further unwound and is presented outside the housing part HP in order for the user to watch images on the display device 100.

FIG. 1B shows a fully wound state of the display part DP of the display device 100. The fully wound state refers to a state in which the display part DP of the display device 100 is housed inside the housing part HP so as not to be further wound. That is, the fully wound state may be viewed as a state in which the display part DP is wound and housed inside the housing part HP. When the user is not watching images on the display device 100, it is preferable for the sake of external appearance to have the display part DP housed inside the housing part HP. Further, in the fully wound state in which the display part DP is housed inside the housing part HP, the display device 100 is reduced in volume and easy to transport.

A moving part for winding or unwinding the display part DP to change the display part DP between the fully unwound state and the fully wound state is provided in an example embodiment.

<Moving Part>

Figure 2:
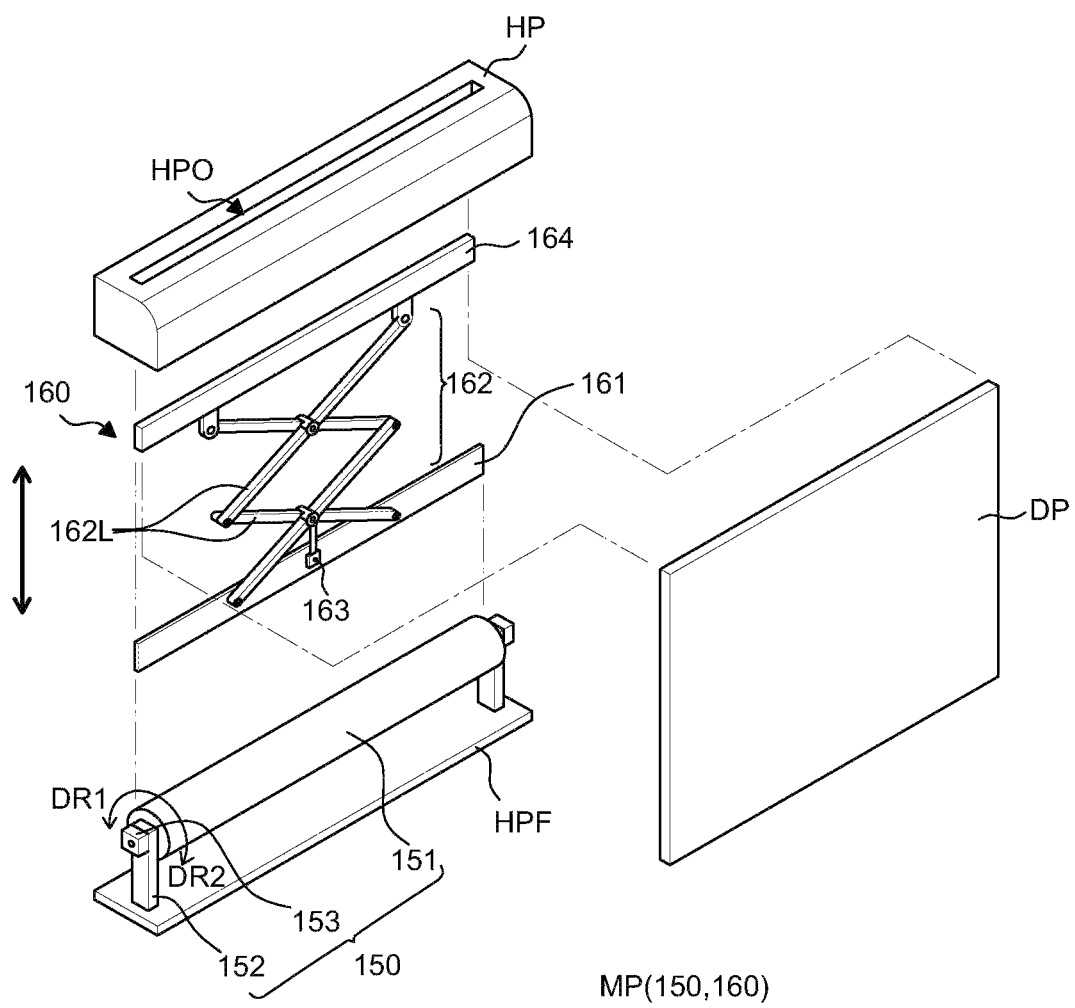
FIG. 2 is an exploded perspective view of the display device according to an example embodiment of the present disclosure.
Figure 3:
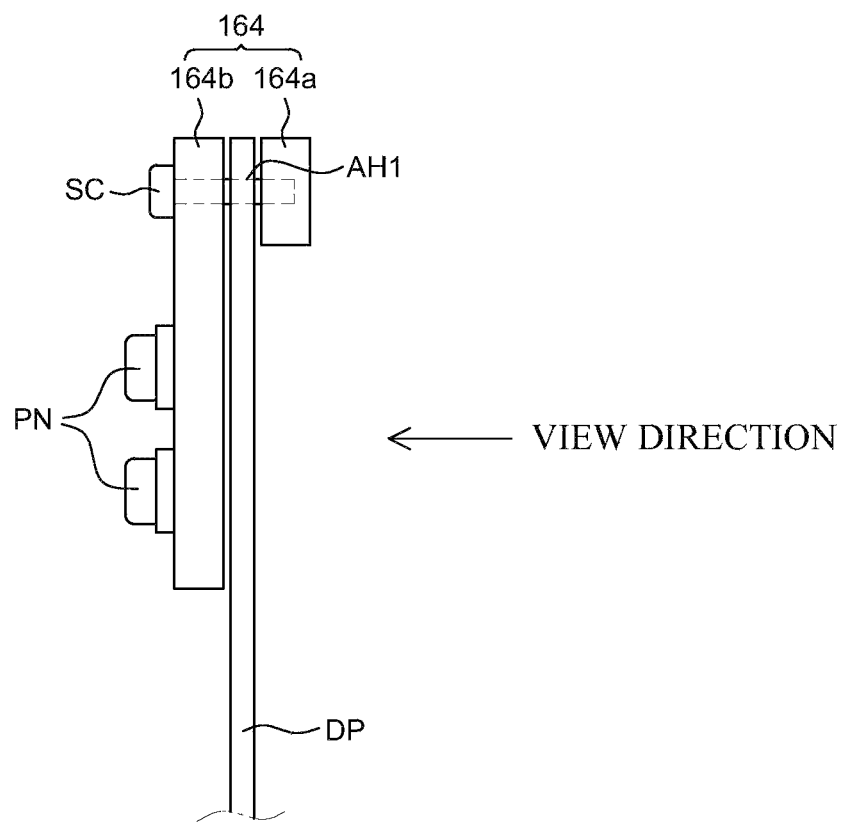
FIG. 3 is a schematic cross-sectional view provided to explain a head bar and a display part of the display device according to an example embodiment of the present disclosure.
Figure 4:
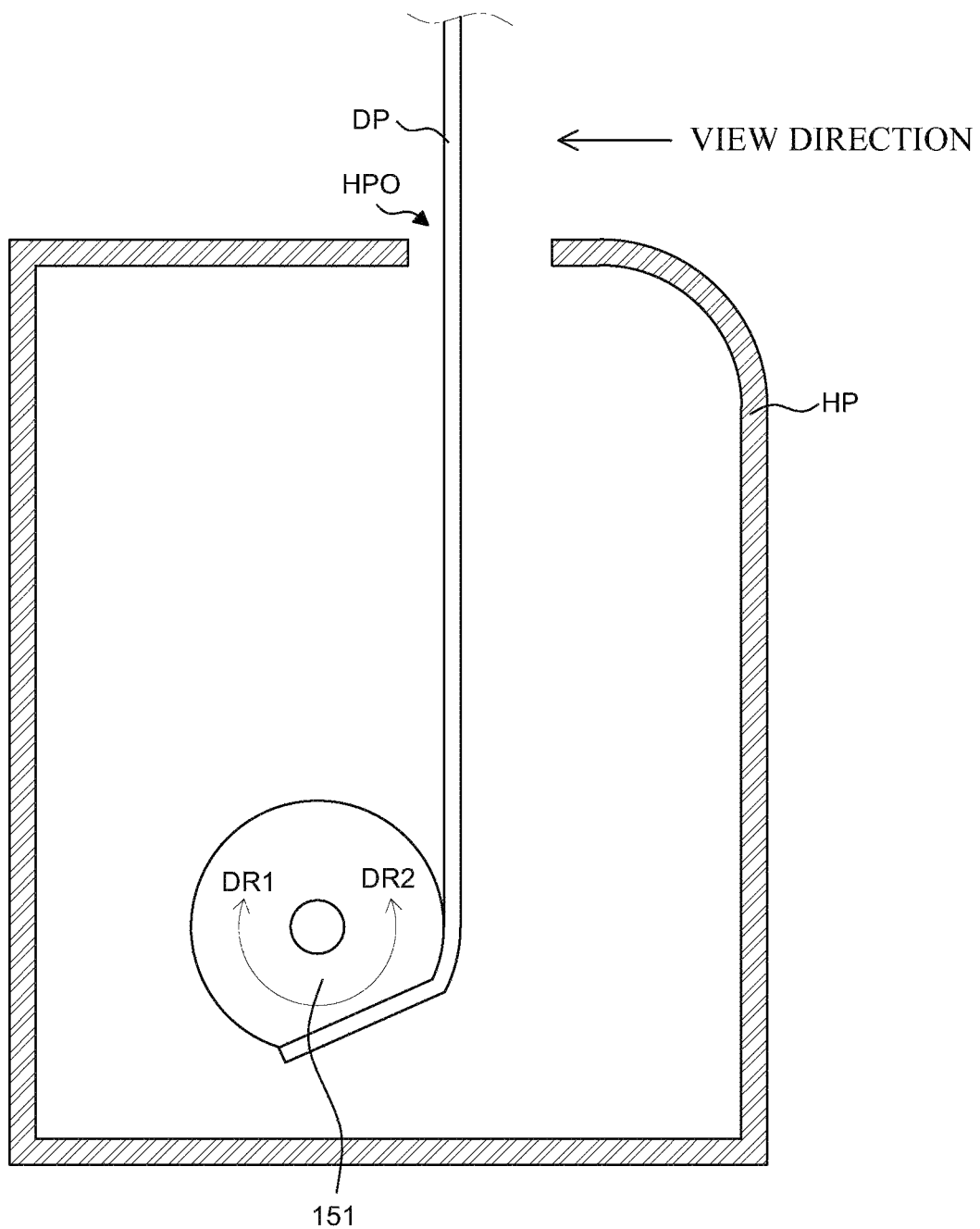
FIG. 4 is a cross-sectional view of the display device according to an example embodiment of the present disclosure.

FIG. 2 is an exploded perspective view of the display device according to an example embodiment of the present disclosure. FIG. 3 is a schematic cross-sectional view provided to explain a head bar and a display part of the display device according to an example embodiment of the present disclosure. FIG. 4 is a cross-sectional view of the display device according to an example embodiment of the present disclosure. FIG. 4 is a schematic cross-sectional view provided to explain a roller 151 and the display part DP of the display device 100 according to an example embodiment of the present disclosure. For convenience of description, FIG. 3 illustrates only a head bar 164 and the display part DP, and FIG. 4 illustrates only the housing part HP, the roller 151, and the display part DP.

First, as illustrated in FIG. 2, a moving part MP may include a roller unit 150 and an elevating unit 160.

The roller unit 150 may wind or unwind the display part DP fixed to the roller unit 150 while rotating in a first direction DR1 or a second direction DR2. The roller unit 150 may include the roller 151, a roller supporting unit 152, and a roller rotating unit 153.

The roller 151 is a member around which the display part DP may be wound. The roller 151 may have, e.g., a cylindrical shape. The lower edge of the display part DP may be fixed to the roller 151. When the roller 151 rotates, the display part DP whose lower edge is fixed to the roller 151 may be wound around the roller 151. On the other hand, when the roller 151 rotates in the opposite direction, the display part DP wound around the roller 151 may be unwound from the roller 151.

As shown in FIG. 4, the roller 151 may have a cylindrical shape overall but may be partially flat. That is, a part of the outer peripheral surface of the roller 151 may be flat, and the other part of the outer peripheral surface may be curved. However, the present disclosure is not limited thereto. The roller 151 may have a completely cylindrical shape or may have any shape around which the display part DP can be wound, but is not limited thereto. The roller 151 will be described below in more detail with reference to FIGS. 9A through 9C.

The roller supporting units 152 may support the roller 151 from both sides of the roller 151. Specifically, the roller supporting units 152 may be disposed on a bottom surface HPF of the housing part HP. Further, upper side surfaces of the respective roller supporting units 152 may be combined with respective ends of the roller 151. Thus, the roller supporting units 152 may support the roller 151 to be spaced apart from the bottom surface HPF of the housing part HP. Here, the roller 151 may be rotatably combined with the roller supporting unit 152.

The roller rotating unit 153 may rotate the roller 151 in the first direction DR1 or the second direction DR2. The roller rotating unit 153 may be disposed on one or each of the pair of roller supporting units 152. For example, the roller rotating unit 153 may be a rotary motor that transfers rotatory power to the roller 151, but is not limited thereto.

The elevating unit 160 may move the display part DP up and down according to driving of the roller unit 150. The elevating unit 160 may include a link supporting unit 161, a link unit 162, a link elevating unit 163, and the head bar 164.

The link supporting unit 161 may support the link unit 162 and the link elevating unit 163. Specifically, the link supporting unit 161 may support the link unit 162 which may move up and down so that the display part DP does not collide with the boundary of the opening HPO of the housing part HP. The link supporting unit 161 may support the link unit 162 and the display part DP to be movable only up and down but not forward and backward.

The link unit 162 may include a plurality of links 162L hinged to each other. The plurality of links 162L may be rotatably hinged to each other respectively and can be moved up and down by the link elevating unit 163. When the link unit 162 moves up and down, the plurality of links 162L may rotate in a direction to be farther from or closer to each other. More details thereof will be described below with reference to FIG. 4.

The link elevating unit 163 may move the link unit 162 up and down. The link elevating unit 163 may rotate the plurality of links 162L of the link unit 162 to be closer to or farther away from each other, respectively. The link elevating unit 163 may move the link unit 162 up or down to move the display part DP connected to the link unit 162 up or down.

Here, driving of the link elevating unit 163 may be synchronized with driving of the roller rotating unit 153. Thus, the roller unit 150 and the elevating unit 160 may be driven at the same time. For example, when the display part DP is switched from the fully unwound state to the fully wound state, the roller unit 150 may be driven to wind the display part DP around the roller 151. At the same time, the elevating unit 160 may rotate the plurality of links 162L of the link unit 162 to move the display part DP down. Further, when the display part DP is switched from the fully wound state to the fully unwound state, the roller unit 150 may be driven to unwind the display part DP from the roller 151. At the same time, the elevating unit 160 may rotate the plurality of links 162L of the link unit 162 to move the display part DP up.

The head bar 164 of the elevating unit 160 may be fixed to the uppermost end of the display part DP. The head bar 164 may be connected to the link unit 162 and may move the display part DP up and down according to a rotation of the plurality of links 162L of the link unit 162. That is, the display part DP can be moved up and down by the head bar 164, the link unit 162, and the link elevating unit 163.

As illustrated in FIG. 3, the head bar 164 may be disposed on the uppermost end of the display part DP to cover a portion of a front surface and a portion of a rear surface of the display part DP.

The head bar 164 may include a first head bar 164a and a second head bar 164b. The first head bar 164a may cover a front surface of the display part DP. The first head bar 164a may cover only a part of the front surface adjacent to the uppermost edge of the display part DP in order not to cover images displayed on the front surface of the display part DP.

The second head bar 164b may cover a portion of a rear surface of the display part DP. The second head bar 164b may cover only a part of the rear surface adjacent to the uppermost edge of the display part DP. Since images are not displayed on the rear surface of the display part DP, the second head bar 164b may overlap a larger portion of the display part DP than the first head bar 164a.

To fasten the display part DP to the first head bar 164a and the second head bar 164b, first fastening holes AH1 may be formed in the display part DP. Further, screws SC may penetrate the first fastening holes AH1 to fasten the first head bar 164a, the display part DP, and the second head bar 164b together.

The second head bar 164b may include pem nuts PN to which the link unit 162 of the elevating unit 160 may be fastened. The second head bar 164b and link unit 162 of the elevating unit 160 may be fastened to each other by the pem nuts PN. Therefore, when the link unit 162 of the elevating unit 160 moves up and down, the second head bar 164b fastened to the link unit 162 and the first head bar 164a, and the display part DP fastened to the second head bar 164b may move up and down together.

FIG. 3 illustrates an example in which the first head bar 164a and the second head bar 164b have a straight line shape. However, the first head bar 164a and the second head bar 164b may have various other shapes. The shape of the first head bar 164a and the second head bar 164b is not limited to the example illustrated in FIG. 3. For example, the first head bar 164a and the second head bar 164b may have an inverted "L" shape.

Hereafter, an operation of the moving part MP will be described in detail with reference to FIG. 4.

As shown in FIG. 4, the lower edge of the display part DP may be connected to the roller 151. Further, when the roller 151 is rotated by the roller rotating unit 153 (FIG. 2) in the first direction DR1, i.e., in a clockwise direction, the display part DP may be wound around the roller 151 so that the rear surface of the display part DP can be in close contact with a surface of the roller 151.

On the other hand, when the roller 151 is rotated by the roller rotating unit 153 in the second direction DR2, i.e., in a counterclockwise direction, the display part DP wound around the roller 151 may be unwound from the roller 151 and presented outside the housing part HP.

In some example embodiments, the moving part MP different in structure from the above-described example moving part MP may be employed in the display device 100. That is, the roller unit 150 and the elevating unit 160 may be changed in configuration as long as the display part DP can be wound and unwound. Some of their components may be omitted or modified, or other components may be added.

<Display Part>

Figure 5:
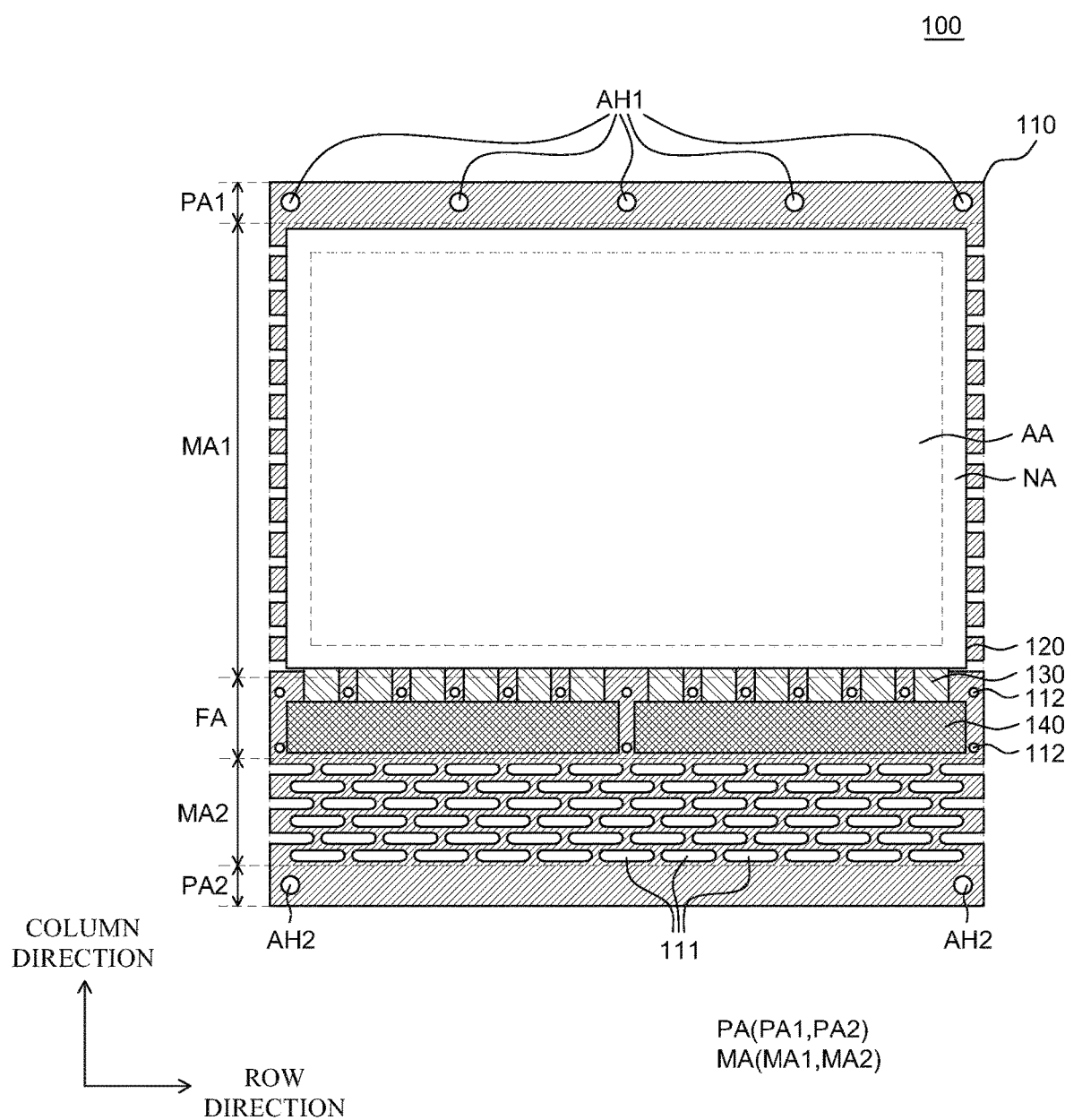
FIG. 5 is a plan view of a display part of the display device according to an example embodiment of the present disclosure.
Figure 6:
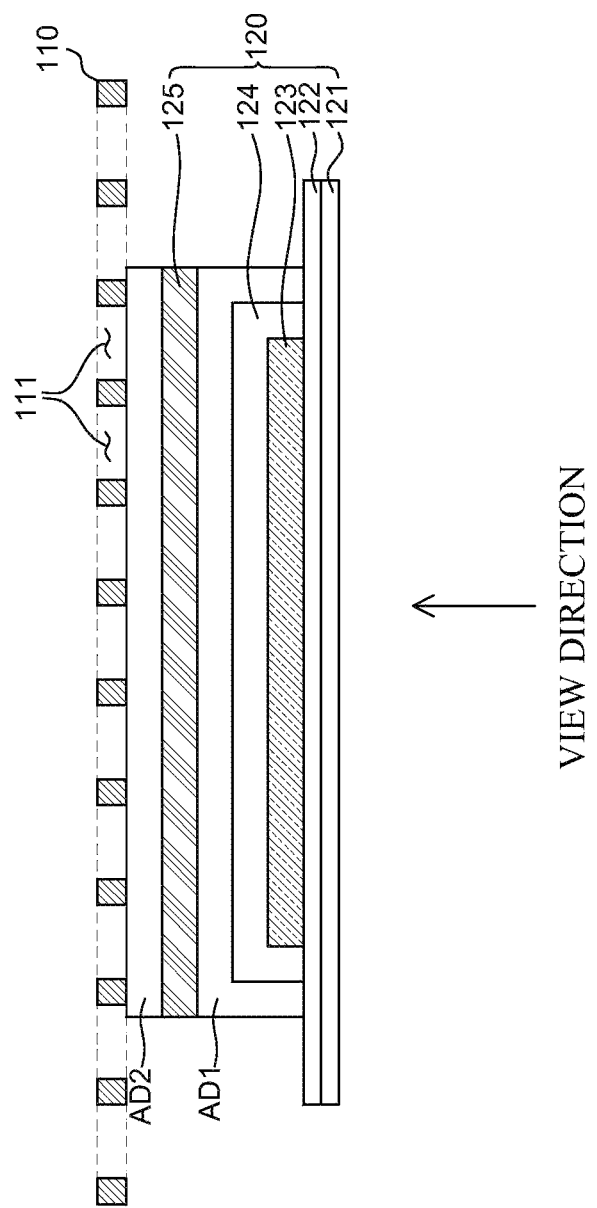
FIG. 6 is a cross-sectional view of the display part of the display device according to an example embodiment of the present disclosure.

FIG. 5 is a plan view of a display part DP of the display device according to an example embodiment of the present disclosure. FIG. 6 is a cross-sectional view of the display part DP of the display device according to an example embodiment of the present disclosure.

As illustrated in FIG. 5, the display part DP may include a back cover 110, a display panel 120, flexible films 130, and printed circuit boards 140.

The display panel 120 may be configured to display images to the user. In the display panel 120, display elements for displaying images, driving elements for driving the display elements, and lines for transmitting various signals to the display elements and the driving elements may be disposed. Different types of display elements may be employed depending on the kind of the display panel 120. For example, if the display panel 120 is an organic light emitting display panel, the display elements may be organic light emitting elements, each composed of an anode, an organic emission layer, and a cathode. As another example, if the display panel 120 is a liquid crystal display panel, the display elements may be liquid crystal display elements. Hereinafter, the display panel 120 may be described as an organic light emitting display panel as an example, but the display panel 120 is not limited to the organic light emitting display panel. Further, since the display device 100 according to an example embodiment of the present disclosure is a rollable display device, the display panel 120 may be implemented as a flexible display panel to be wound around or unwound from the roller 151.

The display panel 120 may include an active area AA and a non-active area NA.

The active area AA refers to an area where an image may be displayed on the display panel 120. In the active area AA, a plurality of sub-pixels and a circuit for driving the plurality of sub-pixels may be disposed. The plurality of sub-pixels may represent a minimum unit of the active area AA, and a display element may be disposed in each of the plurality of sub-pixels. For example, an organic light emitting element composed of an anode, an organic emission layer, and a cathode may be disposed in each of the plurality of sub-pixels, but the present disclosure is not limited thereto. Further, the circuit for driving the plurality of sub-pixels may include, without limitation, a driving element and a line. For example, the circuit may be composed of such elements as a thin film transistor (TFT), a storage capacitor, a gate line, and a data line, but is not limited thereto.

The non-active area NA of the display part 120 is an area where no image is to be displayed. In the non-active area NA, various lines, circuits, and other components for driving the organic light emitting elements in the active area AA may be disposed. For example, in the non-active area NA, link lines for transmitting signals to the plurality of sub-pixels and circuits in the active area AA or driver ICs, such as a gate driver IC, a data driver IC, and other similar driver ICs, may be disposed. However, non-active area of the present disclosure is not limited thereto.

The flexible films 130 may include various components on a flexible base film and may serve to supply signals to the plurality of sub-pixels and circuits in the active area AA. The flexible films 130 may be electrically connected to the display panel 120. The flexible films 130 may be disposed at one end of the non-active area NA of the display panel 120 and may supply power voltage, data voltage, or other voltages or signals to the plurality of sub-pixels and circuits in the active area AA. The specific number of flexible films 130 illustrated in FIG. 5 is merely an example. The number of flexible films 130 is not limited to the illustrated example, and the number of flexible films may vary depending on the design.

On the flexible films 130, driver ICs, such as a gate driver IC and a data driver IC, may be disposed. The driver ICs may be configured to process data for displaying an image and a driving signal for processing the data. The driver ICs may be mounted in a Chip On Glass (COG) method, a Chip On Film (COF) method, a Tape Carrier Package (TCP), or other similar methods. For convenience of description, the driver ICs may be described, for example, as being mounted on the flexible films 130 in the COF method, but the present disclosure is not limited thereto.

The printed circuit boards 140 may be disposed on one ends of the flexible films 130 and connected to the flexible films 130. The printed circuit boards 140 may be configured to supply signals to the driver ICs. The printed circuit boards 140 may supply various signals, such as a drive signal, a data signal, or other signals, to the driver ICs. In the printed circuit boards 140, various components may be disposed. For example, a timing controller and a power supply unit, among others, may be disposed on the printed circuit boards 140. FIG. 5 illustrates two printed circuit boards 140 as an example. However, the number of printed circuit boards 140 is not limited to the illustrated example and may vary depending on the design.

Although not illustrated in FIG. 5, one or more additional printed circuit boards connected to the printed circuit boards 140 may be further disposed. For example, the printed circuit boards 140 may be referred to as a source printed circuit board (source PCB) S-PCB on which a data driver is mounted. An additional printed circuit board connected to the printed circuit boards 140 may be referred to as a control printed circuit board (control PCB) C-PCB on which a timing controller or the like is mounted. The additional printed circuit boards may be disposed inside the roller 151, or may be disposed within the housing part HP outside the roller 151.

The back cover 110 may be disposed on rear surfaces of the display panel 120, the flexible films 130, and the printed circuit boards 140, and may support the display panel 120, the flexible films 130, and the printed circuit boards 140. Thus, the back cover 110 may be larger in size than the display panel 120. The back cover 110 can protect the other components of the display part DP against the external environment. The back cover 110 may be formed of a rigid material, but at least a part of the back cover 110 may have flexibility to be wound or unwound along with the display panel 120. For example, the back cover 110 may be formed of a metal material, such as Steel Use Stainless (SUS) or Invar, or a plastic material. However, the material of the back cover 110 is not limited thereto. Various different materials may be employed for the back cover 110 depending on the design as long as they can satisfy property characteristics, such as an amount of thermal deformation, a radius of curvature, rigidity, and the like.

As shown in FIG. 6, the display panel 120 may include a substrate 121, a buffer layer 122, a pixel unit 123, an encapsulation layer 124, and an encapsulation substrate 125.

The substrate 121 may serve as a base member to support various components of the display panel 120 and may be formed of an insulating material. The substrate 121 may be formed of a flexible material so that the display panel 120 may be wound or unwound. For example, the substrate 121 may be formed of a plastic material, such as polyimide (PI).

The buffer layer 122 may suppress diffusion of moisture and/or oxygen permeating from the outside of the substrate 121. The buffer layer 122 may be formed as a single layer or a multilayer of silicon oxide (SiOx) and silicon nitride (SiNx), but is not limited thereto.

The pixel unit 123 may include a plurality of organic light emitting elements and circuits for the organic light emitting elements. The pixel unit 123 may be disposed in an area corresponding to the active area AA. Each organic light emitting element may include an anode, an organic emission layer, and a cathode.

The anode may supply holes into the organic emission layer and may be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode, and emit light. The organic emission layer may be one of a red organic emission layer, a green organic emission layer, a blue organic emission layer, and a white organic emission layer depending on the color of light emitted from the organic emission layer. If the organic emission layer is a white organic emission layer, color filters of various colors may be further provided.

The cathode may supply electrons into the organic emission layer and may be formed of a conductive layer having a low work function. For example, the cathode may be formed of one or more materials selected from a group of metals, such as magnesium (Mg), silver (Ag), and aluminum (Al) and alloys thereof, but is not limited thereto.

The display panel 120 may be classified into a top emission type or a bottom emission type according to a transmission direction of light emitted from the organic light emitting element.

In the top emission type, light emitted from the organic light emitting element may be discharged away from the substrate 121 on which the organic light emitting element is disposed. If the display panel 120 is of top emission type, a reflective layer may be further provided under the anode. This is to discharge light emitted from the organic light emitting element away from the substrate 121, i.e., toward the cathode.

In the bottom emission type, light emitted from the organic light emitting element is discharged toward the substrate 121 on which the organic light emitting element is formed. If the display panel 120 is of bottom emission type, the anode may be formed of a transparent conductive material only and the cathode may be formed of a metal material having high reflectivity. This is to discharge light emitted from the organic light emitting element toward the substrate 121.

Hereafter, for convenience of description, the display device 100 according to an example embodiment of the present disclosure will be described as a bottom emission type display device, but is not limited thereto.

In the pixel unit 123, a circuit for driving organic light emitting elements may be disposed. The circuit may be composed of a TFT, a storage capacitor, a gate line, a data line, a power line, and possibly other components. The components of the circuit may vary depending on the design of the display device 100.

The encapsulation layer 124 may be disposed on and cover the pixel unit 123. The encapsulation layer 124 may seal the organic light emitting elements of the pixel unit 123. The encapsulation layer 124 may protect the organic light emitting elements of the pixel unit 123 against external moisture, oxygen, impacts, and the like. The encapsulation layer 124 may be formed by alternately laminating a plurality of inorganic layers and a plurality of organic layers. For example, the inorganic layers may be formed of inorganic materials, such as silicon nitride (SiNx), silicon oxide (SiOx), and aluminum oxide (AlOx), but are not limited thereto. For example, the organic layers may be formed of epoxy-based or acryl-based polymers, but are not limited thereto.

The encapsulation substrate 125 may be disposed on the encapsulation layer 124. The encapsulation substrate 125 may protect the organic light emitting elements of the pixel unit 123 together with the encapsulation layer 124. The encapsulation substrate 125 may protect the organic light emitting elements of the pixel unit 123 against external moisture, oxygen, impacts, and the like. The encapsulation substrate 125 may be formed of a metal material which has high corrosion resistance and can be easily processed into a foil or a thin film. Examples of the metal material may include aluminum (Al), nickel (Ni), chromium (Cr), an alloy of iron (Fe) and Ni, and other similar materials. Thus, since the encapsulation substrate 125 may be formed of a metal material, the encapsulation substrate 125 can be implemented in the form of an ultra-thin film and can provide high resistance to external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 may be formed of an adhesive material and may be a thermosetting or naturally-curable adhesive. For example, the first adhesive layer AD1 may be formed of an optical clear adhesive (OCA), a pressure sensitive adhesive (PSA), or the like, but is not limited thereto.

The first adhesive layer AD1 may be disposed to cover the encapsulation layer 124 and the pixel unit 123. That is, the pixel unit 123 may be sealed by the buffer layer 122 and the encapsulation layer 124, and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, impacts, and the like, together with the encapsulation layer 124 and the encapsulation substrate 125. In this case, the first adhesive layer AD1 may further contain a moisture absorbent. The moisture absorbent may include hygroscopic particles and may absorb moisture and oxygen from the outside to minimize permeation of moisture and oxygen into the pixel unit 123.

The back cover 110 may be disposed on the encapsulation substrate 125. The back cover 110 may be disposed to be in contact with the encapsulation substrate 125 of the display panel 120 to protect the display panel 120. The back cover 110 may be formed of a rigid material to protect the display panel 120.

A second adhesive layer AD2 may be disposed between the encapsulation substrate 125 and the back cover 110. The second adhesive layer AD2 may bond the encapsulation substrate 125 and the back cover 110 to each other. The second adhesive layer AD2 may be formed of an adhesive material and may be a thermosetting or naturally-curable adhesive. For example, the second adhesive layer AD2 may be formed of an optical clear adhesive (OCA), a pressure sensitive adhesive (PSA), or the like, but is not limited thereto.

FIG. 6 illustrates that a plurality of openings 111 of the back cover 110 is not filled with the second adhesive layer AD2. However, some or all of the plurality of openings 111 of the back cover 110 may be filled with the second adhesive layer AD2. If the second adhesive layer AD2 fills in the plurality of openings 111 of the back cover 110, a contact area between the second adhesive layer AD2 and the back cover 110 increases. Thus, it is possible to prevent or suppress separation between the back cover 110 and the display panel 120.

Although not illustrated in FIG. 6, a transparent film may be further disposed on a front surface of the substrate 121 (i.e., a lower surface of the substrate 121 as illustrated in FIG. 6). The transparent film may function to protect a front surface or a viewing surface of the display panel 120 or minimize reflection of external light incident on the display panel 120. For example, the transparent film may be at least one of a polyethyleneterephthalate (PET) film, an anti-reflection film, a polarizing film, and a transmittance controllable film, but is not limited thereto.

Hereafter, the back cover 110 will be described in more detail with reference to FIG. 7A and FIG. 7B.

<Detailed Configuration of an Example Back Cover>

Figure 7A:
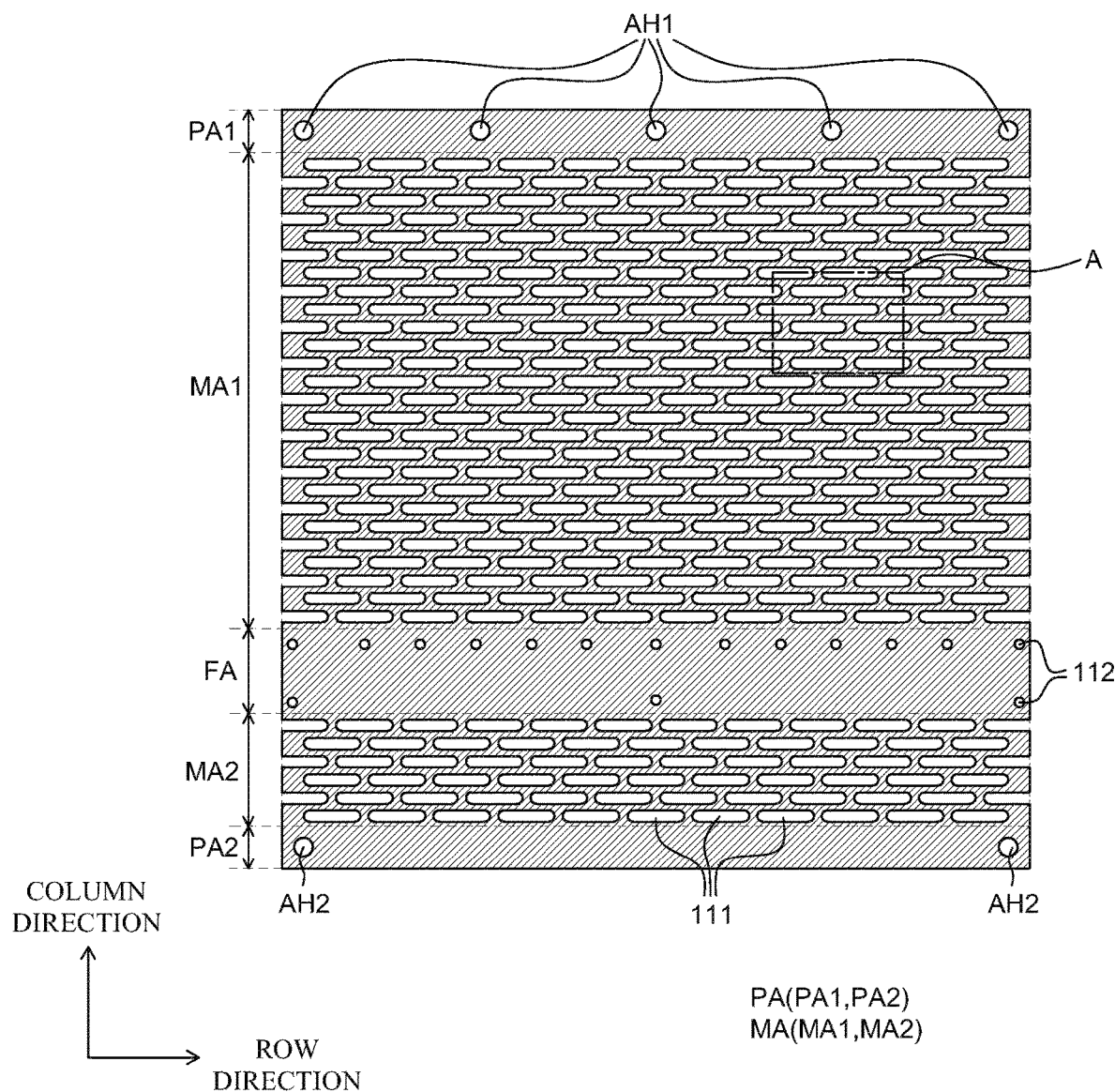
FIG. 7A is a plan view of a back cover of the display device according to an example embodiment of the present disclosure.

FIG. 7A is a plan view of a back cover of the display device according to an example embodiment of the present disclosure. FIG. 7B is an enlarged view of a region "A" of FIG. 7A.

As shown in FIG. 7A, the back cover 110 may include a fixing area FA, a supporting area PA, and a flexible area MA. Specifically, in the fixing area FA, the printed circuit boards 140 and the flexible films 130 may be fixed. In the supporting area PA, the plurality of openings 111 is not disposed. In the flexible area MA, the plurality of openings 111 may be disposed. In this case, the back cover 110 may include a first supporting area PA1 on the upper portion of the back cover 110 and a second supporting area PA2 on the lower portion of the back cover 110. The back cover 110 may also include the fixing area FA between the first supporting area PA1 and the second supporting area PA2. The back cover 110 may further include a first flexible area MA1 between the first supporting area PA1 and the fixing area FA, and a second flexible area MA2 between the fixing area FA and the second supporting area PA2.

As shown in FIG. 7A, the first supporting area PA1 of the back cover 110 is the uppermost area of the back cover 110 and may be fastened to the head bar 164. The first supporting area PA1 may include the first fastening holes AH1 to be fastened with the head bar 164. Further, as described above with reference to FIG. 3, the screws SC penetrating the head bar 164 and the first fastening holes AH1 may be provided to fasten the head bar 164 to the first supporting area PA1 of the back cover 110. Further, since the first supporting area PA1 may be fastened to the head bar 164, the back cover 110 can move up or down at the same time when the link unit 162 fixed to the head bar 164 moves up or down. The display panel 120 attached to the back cover 110 can also move up or down. FIG. 7A illustrates five first fastening holes AH1 as an example, but the number of first fastening holes AH1 may vary and is not limited to this illustrated example. Further, FIG. 7A illustrates that the back cover 110 may be fastened to the head bar 164 using the first fastening holes AH1. However, the present disclosure is not limited thereto. The back cover 110 may be attached to the head bar 164 without fastening holes.

As shown in FIG. 7A, the second supporting area PA2 of the back cover 110 is the lowermost area of the back cover 110 and may be fixed to the roller 151. The second supporting area PA2 may include second fastening holes AH2 to be fastened to the roller 151. For example, screws SC penetrating the roller 151 and the second fastening holes AH2 may be provided to fasten the roller 151 to the second supporting area PA2 of the back cover 110. Further, since the second supporting area PA2 may be fastened to the roller 151, the back cover 110 may be wound around or unwound from the roller 151 by rotation of the roller 151. FIG. 7A illustrates two second fastening holes AH2 as an example, but the number of second fastening holes AH2 may vary and is not limited to the illustrated example.

The fixing area FA may be an area disposed between the first supporting area PA1 and the second supporting area PA2. The flexible films 130 connected to one end of the display panel 120 and the printed circuit boards 140 may be fixed in the fixing area FA.

The fixing area FA may enable the flexible films 130 and the printed circuit boards 140 to be wound flat around the roller 151, without being curved, to protect the flexible films 130 and the printed circuit boards 140. Further, the roller 151 may also be partially flat to correspond to the fixing area FA and to maintain the fixing area FA flat. Details thereof are described below with reference to FIGS. 9A through 9C.

A plurality of fixing holes 112 may be disposed in the fixing area FA. Each of the plurality of fixing holes 112 may be disposed between the flexible films 130. Thus, it is possible to fix the flexible films 130 and the printed circuit boards 140 more stably together with a base plate 170 and a top cover 180 fastened through the plurality of fixing holes 112. Without the use of fixing holes, during winding or unwinding of the display part DP, the flexible films 130 and the printed circuit boards 140 disposed in the fixing area FA may not be fixed securely but may be shaken. Specifically, during winding or unwinding of the display part DP, the fixing area FA of the back cover 110 may be applied with stress caused by contraction or expansion. Therefore, the plurality of fixing holes 112 may be formed in the fixing area FA to fix the base plate 170 and the top cover 180 together. Thus, the flexible films 130 and the printed circuit boards 140 disposed between the base plate 170 and the top cover 180 can be fixed more securely. The number of the plurality of fixing holes 112 illustrated in FIG. 7A is just an example and can be varied based on the number of printed circuit boards 140, the number of flexible films 130, and other design considerations. Details of the plurality of fixing holes 112 will be described below with reference to FIGS. 8A and 8B.

The flexible area MA of the back cover 110 may be wound around or unwound from the roller 151 together with the display panel 120. The flexible area MA may overlap at least the display panel 120 among the other components of the display part DP.

The plurality of openings 111 may be disposed in the flexible area MA of the back cover 110. During winding or unwinding of the display part DP, the plurality of openings 111 may be deformed by stress applied to the display part DP. Specifically, during winding or unwinding of the display part DP, the flexible area MA of the back cover 110 may be deformed as the plurality of openings 111 contracts or expands. Further, since the plurality of openings 111 may contract or expand, a slip phenomenon of the display panel 120 disposed on the flexible area MA of the back cover 110 can be minimized or suppressed. Therefore, stress applied to the display panel 120 can be minimized or suppressed.

During winding of the display panel 120 and the back cover 110, there may be a difference in length between the display panel 120 and the back cover 110 which are wound around the roller 151. This is because there is a difference in radius of curvature between the display panel 120 and the back cover 110. For example, if the back cover 110 and the display panel 120 are wound around the roller 151, the back cover 110 and the display panel 120 may need different lengths to be wound once around the roller 151. That is, the display panel 120 is disposed farther away from the roller 151 than the back cover 110 and thus may need a larger length to be wound once around the roller 151 than the back cover 110. As such, a difference in radius of curvature during winding of the display part DP may cause a difference in length for winding of the back cover 110 and the display panel 120. Thus, the display panel 120 attached to the back cover 110 may slip and move from its original position. In this case, a phenomenon that the display panel 120 slips from the back cover 110 due to differences in stress and radius of curvature caused by winding may be defined as a slip phenomenon. If an excessive slip occurs, the display panel 120 may be detached from the back cover 110 or defects such as cracks may occur.

In this case, in the display device 100 according to an example embodiment of the present disclosure, even if the display part DP is applied with stress while being wound or unwound, the plurality of openings 111 of the back cover 110 may be flexibly deformed to reduce stress applied to the back cover 110 and the display panel 120. For example, when the back cover 110 and the display panel 120 are wound around the roller 151, stress that deforms the back cover 110 and the display panel 120 in up and down directions may be applied thereto. In this case, the plurality of openings 111 of the back cover 110 may expand in the up and down directions of the back cover 110 and the length of the back cover 110 may also be flexibly changed. Therefore, during winding of the back cover 110 and the display panel, the plurality of openings 111 of the back cover 110 may compensate for a difference in length between the back cover 110 and the display panel 120 caused by a difference in radius of curvature. Further, during winding of the back cover 110 and the display panel 120, the plurality of openings 111 may be deformed to reduce stress applied to the display panel 120 from the back cover 110.

Figure 7B:
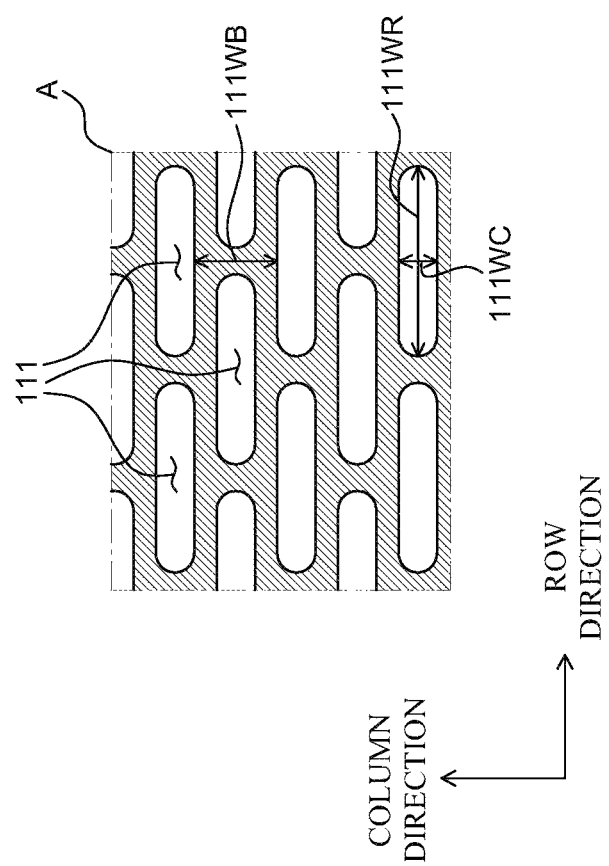
FIG. 7B is an enlarged view of a region "A" of FIG. 7A.

As illustrated in FIG. 7A and FIG. 7B, the plurality of openings 111 may be staggered with the plurality of openings 111 of adjacent rows. For example, the plurality of openings 111 of one row may be staggered with respect to the plurality of openings 111 of rows adjacent to the corresponding row. Specifically, the centers of plurality of openings 111 in odd-numbered rows may be offset from the centers of the plurality of openings 111 in even-numbered rows by as much as, e.g., ½ of the width 111WR (see, e.g., FIG. 7B) of each opening 111 in a row-direction. The placement and arrangement of the plurality of openings 111 are shown in FIG. 7A as an example only, and are not limited thereto.

Since the plurality of openings 111 in one row may be staggered with respect to the openings 111 in an adjacent row, a distance 111WB (see, e.g., FIG. 7B) between the two adjacent openings 111 with their centers aligned in the column direction can be reduced or minimized. Specifically, in the flexible areas MA, an area between the plurality of openings 111 whose centers are aligned in the column direction may have rigidity. Further, during winding of the back cover 110, the back cover 110 may be bent in the column direction. Thus, as the length 111WB of the partial area between two adjacent openings 111 whose centers are aligned in the column direction increases, it may become more difficult to bend the back cover 110 in the column direction. In this case, since the plurality of openings 111 is staggered from row to row, the distance 111WB between the plurality of openings 111 whose centers are aligned in the column direction can be reduced or minimized, compared to an arrangement in which the openings 111 are not staggered from row to row. Also, the area between the plurality of openings 111 can be reduced or minimized. The distance 111WB between the plurality of openings 111 whose centers are aligned in the column direction may decrease, and the flexible areas MA may be extended continuously in the column direction to remove or reduce the area where the plurality of openings 111 is not disposed. Also, because the length 111WB of the area between the plurality of openings 111 having rigidity in the column direction can be reduced or minimized, the overall rigidity of the back cover 110 can be improved without interfering with winding or unwinding of the back cover 110.

As illustrated in FIG. 7B, the maximum width 111WR of the plurality of openings 111 in the row direction may be larger than the maximum width 111WC in the column direction. That is, as shown in FIG. 7B, the maximum width 111WR of the plurality of openings 111 in a transverse or the row direction may be larger than the maximum width 111WC of the plurality of openings 111 in a vertical or the column direction.

As the width 111WR of the plurality of openings 111 in the row direction increases, it may become easier for the flexible area MA of the back cover 110 to be flexibly deformed. Specifically, during winding of the back cover 110, the back cover 110 may be bent in the column direction, and stress may be applied to expand the plurality of openings 111 in the column direction. In this case, if the width 111WR of the plurality of openings 111 in the row direction increases, when the plurality of openings 111 is stretched in the column direction, the column-direction width 111WC of the plurality of openings 111 may increase by a greater amount. Further, as the plurality of openings 111 expands in the column direction, stress applied to the flexible areas MA may be reduced. Therefore, by increasing the row-direction width 111WR of the plurality of openings 111, the flexible areas MA of the back cover 110 can be more easily wound or unwound, and stress applied to the flexible areas MA can be reduced.

As the column-direction width 111WC of the plurality of openings 111 increases, the plurality of openings 111 may be more easily formed. However, if the column-direction width 111WC of the plurality of openings 111 increases, the aperture ratio of the plurality of openings 111 in the flexible areas MA may increase. Also, a contact area between the display panel 120 and the back cover 110 which are attached to the flexible areas MA may decrease. In this case, if an overlap area between the display panel 120 and the back cover 110, i.e., a contact area between the back cover 110 and the second adhesive layer AD2, decreases, the back cover 110 may be separated from the second adhesive layer AD2. Therefore, the column-direction width 111WC of the plurality of openings 111 may be controlled to control the adhesive strength between the display panel 120 and the back cover 110 to suppress or prevent separation therebetween. Further, the row-direction width 111WR of the plurality of openings 111 may be controlled such that the back cover 110 can have high flexibility.

In this case, the plurality of openings 111 may be formed in the flexible area MA, but not in the first supporting area PA1 or the second supporting area PA2. That is, the first fastening holes AH1 and the second fastening holes AH2 may be formed in the first supporting area PA1 and the second supporting area PA2, respectively. However, the plurality of openings 111 formed in the flexible area MA is not formed in the first supporting area PA1 or the second supporting area PA2. Further, the first fastening holes AH1 and the second fastening holes AH2 may be different in shape from the plurality of openings 111. The first supporting area PA1 and the second supporting area PA2 may be fixed to the head bar 164 and the roller 151, respectively. Thus, the first supporting area PA1 and the second supporting area PA2 may have higher rigidity than the flexible area MA. Specifically, since the first supporting area PA1 and the second supporting area PA2 have higher rigidity, the first supporting area PA1 and the second supporting area PA2 can be securely fixed to the head bar 164 and the roller 151, respectively. Therefore, the display part DP may be fixed to the roller 151 and the head bar 164 of the moving part MP, and can move in and out of the housing part HP according to an operation of the moving part MP.

In the display device 100 according to an example embodiment of the present disclosure, the back cover 110 including the plurality of openings 111 may be disposed on the rear surface of the display panel 120 to support and protect the display panel 120. The back cover 110 may be formed of a metal material and thus may have rigidity. In addition, the flexible area MA of the back cover 110 in which the display panel 120 is disposed may include the plurality of openings 111, and the back cover 110 may accordingly have improved flexibility. Therefore, in the fully unwound state in which the display part DP of the display device 100 is presented outside the housing part HP, the back cover 110 formed of a rigid material and having high rigidity may support the display panel 120 to be spread flat. On the other hand, in the fully wound state in which the display part DP of the display device 100 is housed inside the housing part HP, the back cover 110 having high flexibility due to the plurality of openings 111 may be wound around the roller 151 and be housed together with the display panel 120 in the housing part HP.

In addition, in the display device 100 according to an example embodiment of the present disclosure, the row-direction width 111WR of the plurality of openings 111 may be controlled such that the back cover 110 can have flexibility. Further, stress applied to the back cover 110 during a winding operation can be reduced. Specifically, during winding of the back cover 110 and the display panel 120 around the roller 151, the back cover 110 may be bent in the column direction, and stress may be applied to expand the plurality of openings 111 in the column direction. Since the plurality of openings 111 has a relatively large row-direction width 111WR, the plurality of openings 111 can more easily expand in the column direction during winding of the back cover 110 and the display panel 120 around the roller 151, thereby reducing the stress applied to the back cover 110. Therefore, in the display device 100 according to an example embodiment of the present disclosure, by controlling the row-direction width 111WR of the plurality of openings 111, the flexibility of the back cover 110 can be improved, and the back cover 110 and the display panel 120 can be more easily wound around the roller 151. Further, since the plurality of openings 111 can reduce stress applied to the back cover 110 and the display panel 120 while expanding in the column direction, damage to the display panel 120 can be suppressed.

Furthermore, in the display device 100 according to an example embodiment of the present disclosure, the column-direction width 111WC of the plurality of openings 111 may be controlled to control adhesive strength between the back cover 110 and the display panel 120. Specifically, the display panel 120 may be attached to the flexible area MA of the back cover 110. In this case, as the aperture ratio of the plurality of openings 111 in the flexible area MA increases, a contact area between the display panel 120 and the back cover 110 decreases. Thus, the adhesive strength between the display panel 120 and the back cover 110 may decrease. However, in the display device 100 according to an example embodiment of the present disclosure, the plurality of openings 111 in the back cover 110 may have a relatively small column-direction width 111WC. Thus, the aperture ratio of the plurality of openings 111 can be reduced, and the contact area between the display panel 120 and the back cover 110 can be increased. As the contact area between the display panel 120 and the back cover 110 increases, the adhesive strength between the display panel 120 and the back cover 110 can be improved. Therefore, in the display device 100 according to an example embodiment of the present disclosure, by controlling the column-direction width 111WC of the plurality of openings 111, the adhesive strength between the back cover 110 and the display panel 120 can be maintained at a certain level or higher to suppress separation therebetween.

In addition, the row-direction width of the plurality of openings 111 may be larger than the column-direction width, and the shape of the plurality of openings 111 is not limited to the example shape illustrated in FIG. 7A and FIG. 7B. The plurality of openings 111 may have various shapes, such as a dumbbell shape, a diamond shape, a ribbon shape, an oval shape, or other similar shapes.

As illustrated in FIG. 7A, the flexible area MA of the back cover 110 may include a first flexible area MA1 between the first supporting area PA1 and the fixing area FA, and a second flexible area MA2 between the fixing area FA and the second supporting area PA2.

The first flexible area MA1 may extend from the fixing area FA to the upper side of the back cover 110. In the first flexible area MA1, the plurality of openings 111 may be disposed. The display panel 120 may be attached to the first flexible area MA1.

The second flexible area MA2 may be an area extending from the fixing area FA to the lower side of the back cover 110. In the second flexible area MA2, the plurality of openings 111 may be disposed, but the display panel 120 is not disposed. The second flexible area MA2 may extend to enable the active area AA of the display panel 120 to be presented outside the housing part HP. For example, when the back cover 110 and the display panel 120 are in the fully unwound state, an area ranging from the second supporting area PA2 of the back cover 110 fixed to the roller 151 to the fixing area FA, to which the flexible films 130 and the printed circuit boards 140 are attached, may be disposed inside the housing part HP. At the same time, an area ranging from the first flexible area MA1, to which the display panel 120 is attached, to the first supporting area PA1 may be presented outside the housing part HP. In this case, if a length from the second supporting area PA2 fixed to the roller 151 to the second flexible area MA2 and the fixing area FA is smaller than a length from the second supporting area PA2 to the opening HPO of the housing part HP, a part of the first flexible area MA1, to which the display panel 120 is attached, may be disposed inside the housing part HP. Therefore, since a part of a lower end of the active area AA of the display panel 120 is disposed inside the housing part HP, it may be difficult to watch full images on the display panel 120. Therefore, the length from the second supporting area PA2 fixed to the roller 151 to the second flexible area MA2 and the fixing area FA may be designed to be substantially equal to the length from the second supporting area PA2 fixed to the roller 151 to the opening HPO of the housing part HP.

<Clamp Structure of a Base Plate and a Top Cover>

Figure 8A:
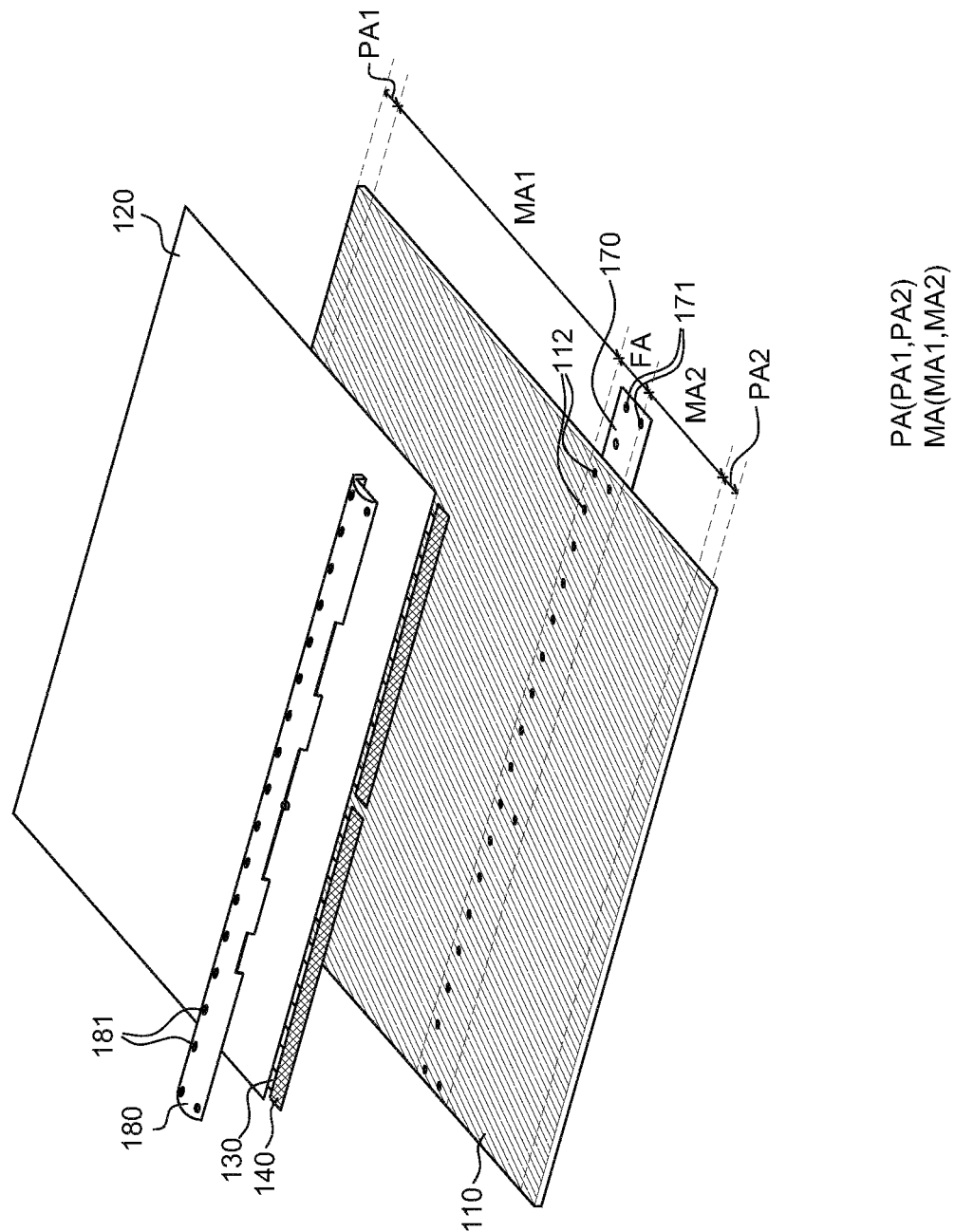
FIG. 8A is an exploded perspective view of the display device according to an example embodiment of the present disclosure.
Figure 8B:
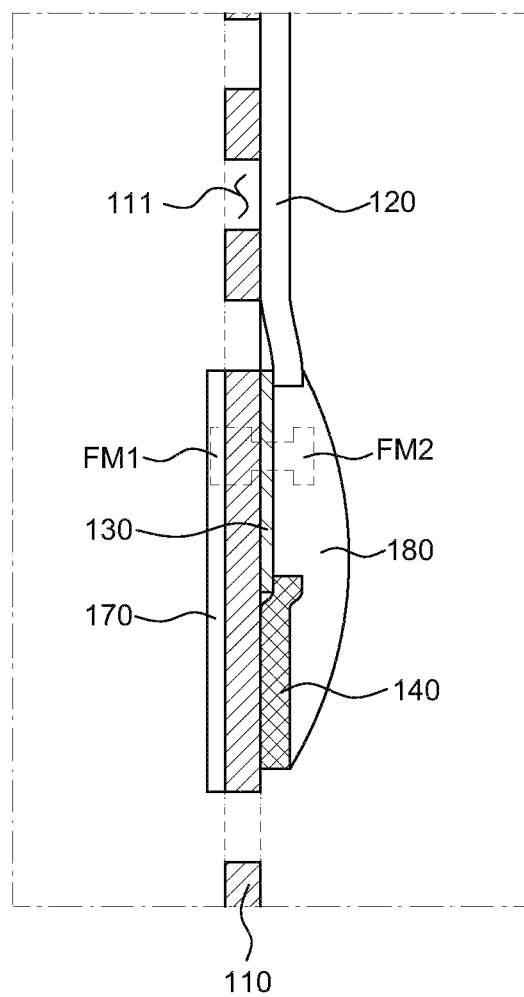
FIG. 8B is a cross-sectional view of a clamp structure of the display device according to an example embodiment of the present disclosure.

FIG. 8A is an exploded perspective view of the display device according to an example embodiment of the present disclosure. FIG. 8B is a cross-sectional view of a clamp structure of the display device according to an example embodiment of the present disclosure.

As shown in FIG. 8A and FIG. 8B, the display device 100 according to an example embodiment of the present disclosure may include the base plate 170 and the top cover 180. The base plate 170 may be disposed on a part of a surface (e.g., a rear surface) of the back cover 110 so as to support the back cover 110. The top cover 180 may be disposed on a part of the other surface (e.g., a front surface) of the back cover 110 so that the back cover 110 is interposed between the base plate 170 and the top cover 180. The top cover 180 may be fixed to the back cover 110. Specifically, the base plate 170 may be disposed on a rear surface of the back cover 110 and support the back cover 110. The top cover 180 may be disposed above the back cover 110 and fix the back cover 110 so as to be clamped to the base plate 170. The back cover 110, the flexible films 130 and the printed circuit boards 140 may be disposed between the base plate 170 and the top cover 180.

As illustrated in FIG. 8A and FIG. 8B, the base plate 170 may be disposed on the rear surface of the back cover 110 and be clamped to the top cover 180. Thus, a mechanical movement of the flexible films 130 and the printed circuit boards 140 disposed on the back cover 110 can be suppressed. Specifically, the base plate 170 may include a plurality of coupling holes 171 corresponding to the plurality of fixing holes 112 in the fixing area FA of the back cover 110. Thus, a plurality of fixing members FM may penetrate the plurality of coupling holes 171 in the base plate 170 and the plurality of fixing holes 112 in the fixing area FA of the back cover 110 to clamp the base plate 170 to the top cover 180. If the base plate 170 is formed of a conductive material, it may cause interference in the flexible films 130 and the printed circuit boards 140. Therefore, the base plate 170 may be formed of an insulating material but is not limited thereto.

The top cover 180 may have a curved outer peripheral surface. Specifically, the top cover 180 may have a curved outer peripheral surface so as to follow the shape of the back cover 110 being rolled up. In this case, the curved surface of the back cover 110 may have substantially the same radius of curvature as the roller 151. That is, during winding of the display device 100, the top cover 180 may be disposed on the flat part of the roller 151. The top cover 180 may have an outer peripheral surface having substantially the same radius of curvature as the roller 151. Thus, when disposed on the flat part of the roller 151, the top cover 180 together with the roller 151 may have a substantially circular shape.

The top cover 180 may include a plurality of coupling holes 181 corresponding to the plurality of fixing holes 112 in the fixing area FA of the back cover 110. Thus, the plurality of fixing members FM may penetrate the plurality of coupling holes 171 in the base plate 170, the plurality of fixing holes 112 in the fixing area FA of the back cover 110, and the plurality of coupling holes 181 in the top cover 180 to clamp the base plate 170 to the top cover 180. If the top cover 180 is formed of a conductive material, it may cause interference in the flexible films 130 and the printed circuit boards 140. Therefore, the back cover 110 may be formed of an insulating material but is not limited thereto.

The base plate 170 and the top cover 180 may be clamped to each other by a bidirectional clamping method by which the plurality of fixing members FM may be inserted from different directions. Specifically, the plurality of fixing members FM may include a plurality of first fixing members FM1 penetrating the plurality of coupling holes 171 in the base plate 170. Also, the plurality of fixing members FM may include a plurality of second fixing members FM2 penetrating the plurality of coupling holes 181 in the top cover 180. Thus, the first fixing members FM1 may be inserted from the plurality of coupling holes 171 in the base plate 170 in a direction toward the top cover 180. Also, the second fixing members FM2 may be inserted from the plurality of coupling holes 181 in the top cover 180 in a direction toward the base plate 170 so that the base plate 170 and the top cover 180 can be clamped to each other. The base plate 170, the top cover 180, and the back cover 110 can be fixed to each other by the plurality of fixing members FM. The plurality of fixing members FM clamping the base plate 170 and the top cover 180 together may be, for example, screws, bolts, nuts, or other similar fastening components, but is not limited thereto.

<Winding of a Back Cover and a Display Panel>

Figure 9A:
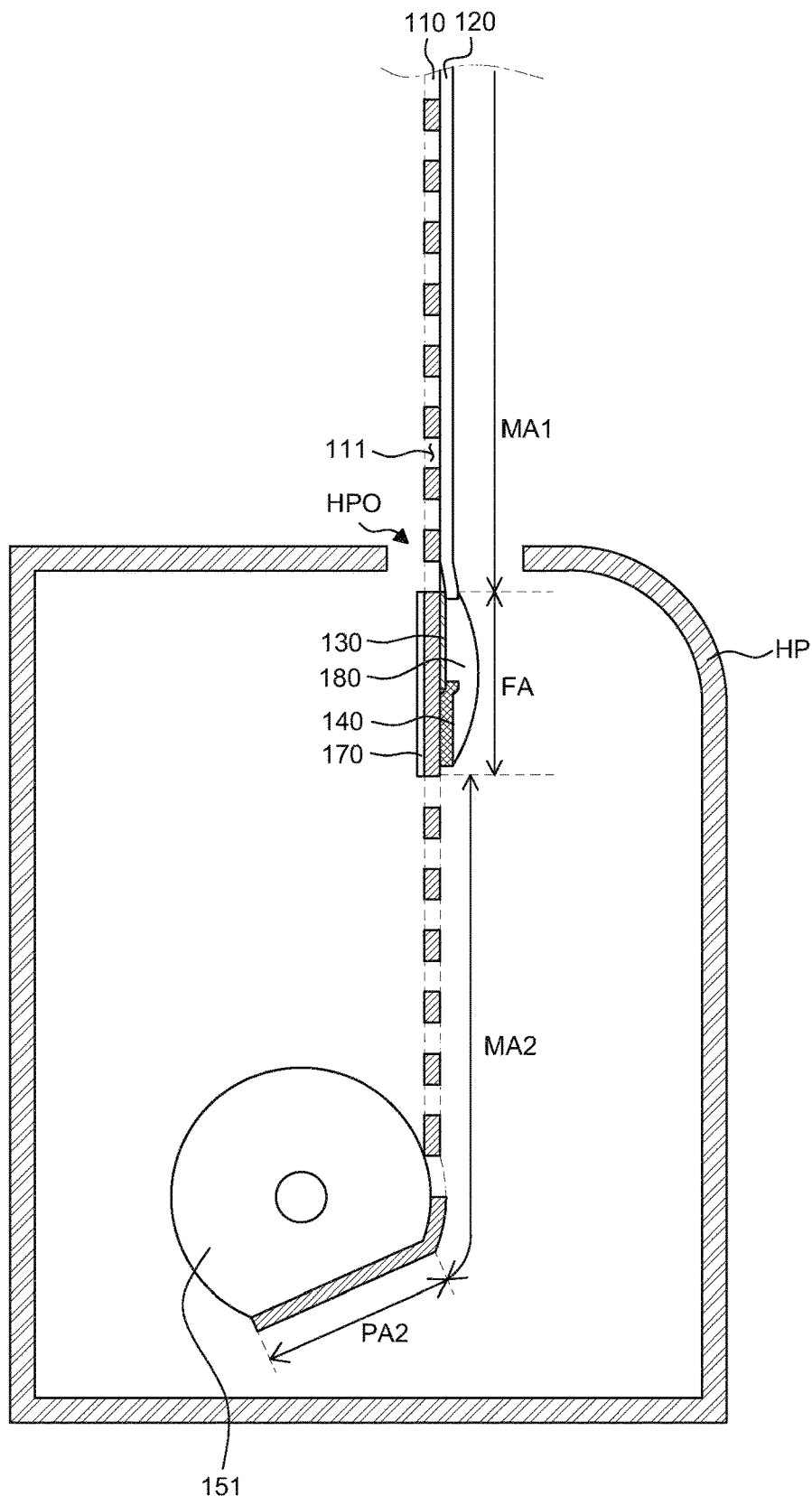
FIGS. 9A through 9C are cross-sectional views of the display device according to an example embodiment of the present disclosure.
Figure 9B:
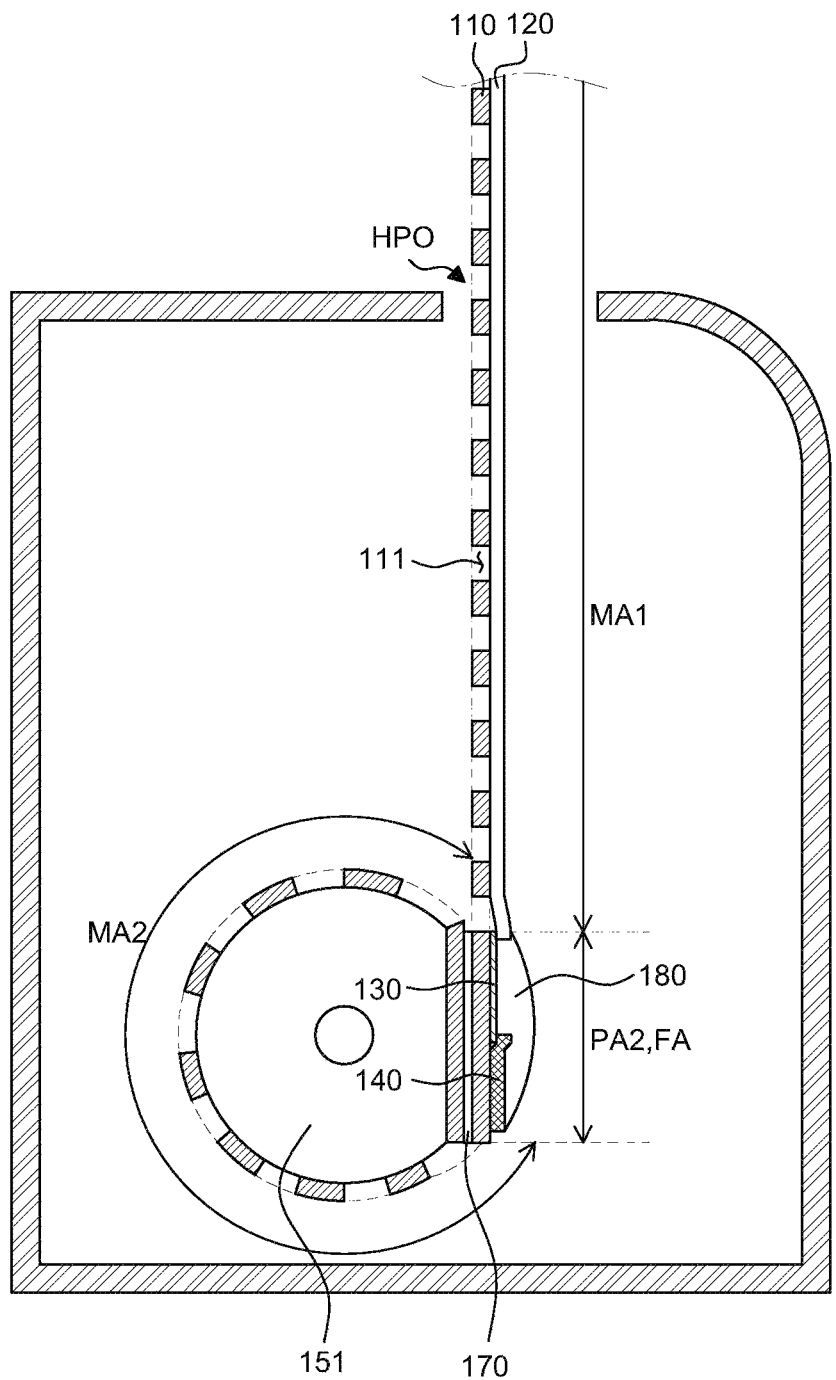
Figure 9C:
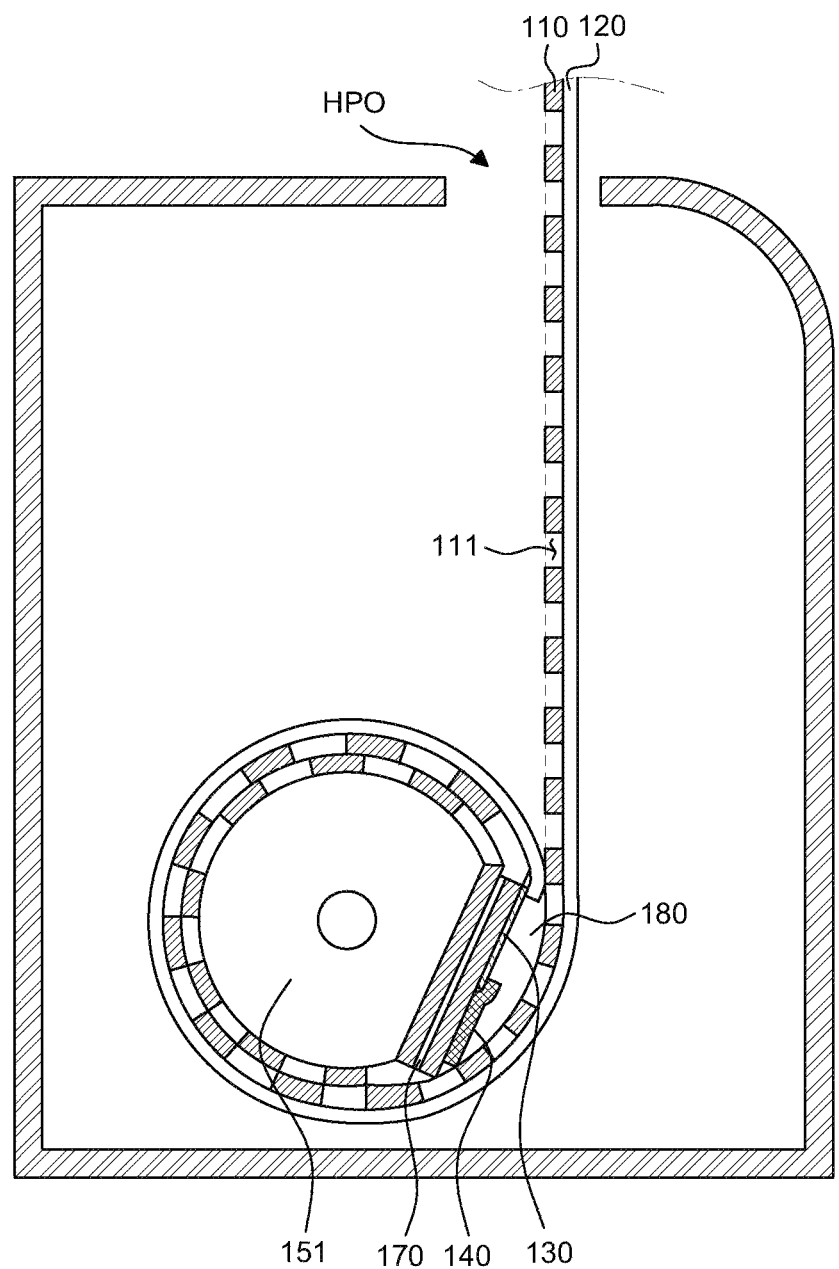

FIGS. 9A through 9C are cross-sectional views of the display device according to an example embodiment of the present disclosure. Specifically, FIG. 9A is a cross-sectional view of the back cover 110 and the display panel 120 fully unwound from the roller 151. FIG. 9B is a cross-sectional view with the second supporting area PA2, the second flexible area MA2, and the fixing area FA of the back cover 110 wound around the roller 151. FIG. 9C is a cross-sectional view with the second supporting area PA2, the second flexible area MA2, the fixing area FA, and a portion of the first flexible area MA1 of the back cover 110 wound around the roller 151.

As illustrated in FIG. 9A, the roller 151 may have a cylindrical shape overall but may be partially flat. That is, a part of the outer peripheral surface of the roller 151 may be flat, and the other part of the outer peripheral surface may be curved.

The second supporting area PA2 may be fixed to the flat part of the roller 151. Except the second supporting area PA2 fixed to the roller 151, the other area of the back cover 110 extended from the second supporting area PA2 may be substantially flat.

The base plate 170 may be disposed on a rear surface of the fixing area FA. Also, the top cover 180 may be disposed on the flexible films 130 and the printed circuit boards 140 disposed in the fixing area FA. The top cover 180 may be disposed to cover the flexible films 130 and the printed circuit boards 140, and may have a convex shape. The top cover 180 may protect the printed circuit boards 140 and the flexible films 130, and may be formed of an insulating material, such as resin, but is not limited thereto.

As described above with reference to FIG. 8A and FIG. 8B, when the back cover 110 is in the fully unwound state, the second flexible area MA2 and the fixing area FA of the back cover 110 may be disposed inside the housing part HP. In this case, the first flexible area MA1 may be presented outside the housing part HP.

As shown in FIG. 9B, the second supporting area PA2, the second flexible area MA2, and the fixing area FA of the back cover 110 may be wound around the roller 151. The first flexible area MA1 extending from the fixing area FA may be unwound from the roller 151.

On the flat part of the outer peripheral surface of the roller 151, the second supporting area PA2 and the fixing area FA may be disposed. On the curved part, the second flexible area MA2 may be disposed.

The fixing area FA to which the printed circuit boards 140 and the flexible films 130 are attached may be wound on the flat part of the roller 151. Thus, the fixing area FA, and the printed circuit boards 140 and the flexible films 130 in the fixing area FA can maintain a flat state without being bent. As a result, the flexible films 130 and the printed circuit boards 140 can constantly maintain a flat state regardless of winding or unwinding of the display part DP. Also, potential damages to the flexible films 130 and the printed circuit boards 140 that may be caused by bending can be suppressed or minimized.

Next, as illustrated in FIG. 9C, the second supporting area PA2, the second flexible area MA2, and the fixing area FA of the back cover 110 may be wound around the roller 151. Also, a part of the first flexible area MA1 may further be wound around the roller 151.

The part of the first flexible area MA1 may be wound to overlap the curved part of the roller 151. That is, the part of the first flexible area MA1 wound on the second flexible area MA2 already wound around the curved part of the roller 151 may be bent along the shape of the curved part of the roller 151.

Another part of the first flexible area MA1 may be wound to overlap the flat part of the roller 151. The second supporting area PA2 wound on the flat part of the roller 151 and this other part of the first flexible area MA1 wound on the fixing area FA may be bent in a similar shape as the part of the first flexible area MA1 wound on the second flexible part MA2 and the curved part of the roller 151.

Specifically, the first flexible area MA1 may be wound around the roller 151 so as to cover the fixing area FA. In this case, the top cover 180 may be disposed between the first flexible area MA1 and the fixing area FA. Therefore, the first flexible area MA1 may be wound to cover the top cover 180 of the fixing area FA and bent along the top surface shape of the top cover 180. Since the top cover 180 has a curved top surface, the first flexible area MA1 may also be bent along the shape of the curved surface. Particularly, a curved top surface of the top cover may correspond in shape to the roller 151. Thus, a cross section of the first flexible area MA1 wound around the roller 151 may have a substantially circular shape.

In the display device 100 according to an example embodiment of the present disclosure, when the display part DP is in the fully unwound state, the back cover 110 can be maintained flat by the fixing area FA and can have rigidity. When the display part DP is in the fully unwound state, the fixing area FA can help maintain a flat state of the display panel 120. The fixing area FA may have a higher rigidity than the plurality of flexible areas MA in which the plurality of openings 111 is formed. Therefore, the fixing area FA may help to maintain the display panel 120 flat in the fully unwound state. Further, the fixing area FA may have high resistance to impacts from the outside of the display part DP and thus can protect the back cover 110 and the display panel 120 attached to the back cover 110.

Further, in a display device according to another example embodiment of the present disclosure, the fixing area FA can constantly maintain a flat state. Thus, potential damages to the flexible films 130 and the printed circuit boards 140 attached to the fixing area FA can be minimized or suppressed. The fixing area FA may refer to an area where the flexible films 130 and the printed circuit boards 140 are attached, and may constantly maintain a flat state. Since the fixing area FA can constantly maintain a flat state, there may not be a need to form the plurality of openings 111 in the fixing area FA. Specifically, during winding of the back cover 110 around the roller 151, the back cover 110 may be bent and wound along the shape of the roller 151. In the display device according to another example embodiment of the present disclosure, the roller 151 may include the flat part on which the fixing area FA is wound. Therefore, the fixing area FA can be wound flat on the roller 151. The fixing area FA can constantly maintain a flat state even when it is wound around the roller 151. Therefore, the flexible films 130 and the printed circuit boards 140 attached to the fixing area FA can also constantly maintain a flat state. For example, during full unwinding of the display part DP, the flexible films 130 and the printed circuit boards 140 can be maintained flat by the fixing area FA having high rigidity. On the other hand, during full winding of the display part DP, the flexible films 130 and the printed circuit boards 140 may be mounted on the flat part of the roller 151 and thus can be maintained flat. Therefore, in the display device according to another example embodiment of the present disclosure, repeated bending of the flexible films 130 and the printed circuit boards 140 can be suppressed or prevented. As a result, potential damages to the flexible films 130 and the printed circuit boards 140 can be minimized or suppressed.

Further, in the display device 100 according to an example embodiment of the present disclosure, the flexible films 130 and the printed circuit boards 140 may be securely fixed to the back cover 110 using the base plate 170 and the top cover 180. Thus, it is possible to protect the flexible films 130 and the printed circuit boards 140. If the display device 100 is repeatedly wound and unwound, the flexible films 130 may be applied with a bending force. Thus, the flexible films 130 may be broken or damaged. The same applies to the printed circuit boards 140. Accordingly, in the display device 100 according to an example embodiment of the present disclosure, the flexible films 130 and the printed circuit boards 140 may be disposed between the base plate 170 and the top cover 180. Also, the base plate 170 and the top cover 180 may be securely fastened to each other using the plurality of fixing members FM. Thus, the flexible films 130 and the printed circuit boards 140 may be securely fixed so as not to be mechanically moved. As a result, potential damages to the flexible films 130 and the printed circuit boards 140 from repeated winding and unwinding can be suppressed or minimized.

Furthermore, in the display device 100 according to an example embodiment of the present disclosure, the top cover 180 may have a curved top surface. Thus, the first flexible area MA1 of the back cover 110 may be bent along the curved surface. Particularly, the curved top surface of the top cover 180 may correspond in shape to the roller 151. Thus, a cross section of the first flexible area MA1 wound around the roller 151 may have a substantially circular shape. Without the top cover 180, the back cover 110 may be disposed to be in contact with the flexible films 130 and the printed circuit boards 140 during repeated winding and unwinding. Accordingly, it is possible to minimize or suppress potential damages to driver ICs on the flexible films 130 and driver ICs on the printed circuit boards 140, and also suppress or prevent separation between the display panel 120 and the back cover 110 as compared to a display device not employing the top cover 180 used in the display device 100.

<Coupling Structure of a Display Device—Addition of a Bottom Cover>

Figure 10:
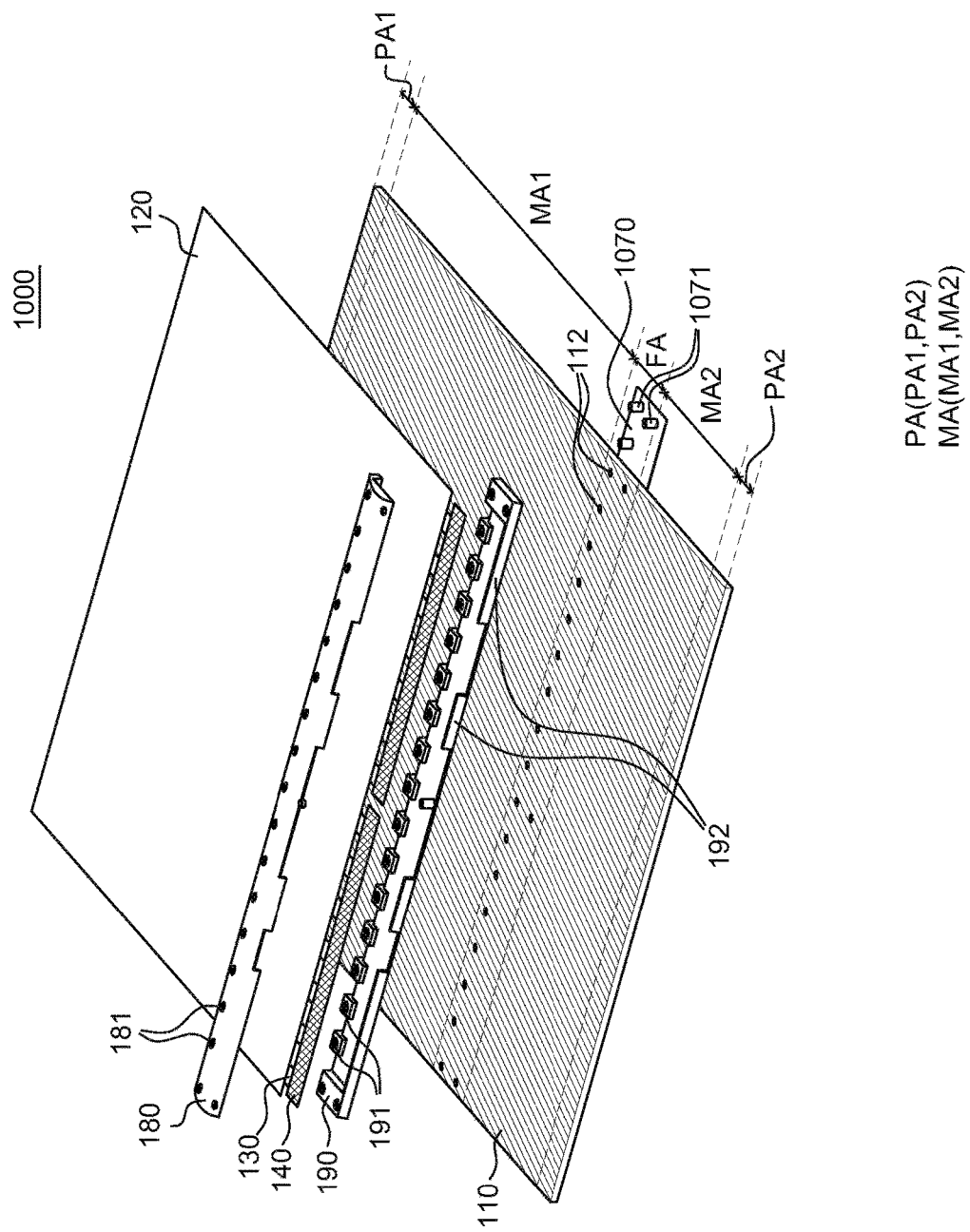
FIG. 10 is an exploded perspective view of a display device according to another example embodiment of the present disclosure.

FIG. 10 is an exploded perspective view of a display device according to another example embodiment of the present disclosure. A display device 1000 illustrated in FIG. 10 may have substantially the same configuration as the example display device 100 illustrated in FIGS. 1 through 9C, except that a fixing member and a base plate 1070 have different structures, and a bottom cover 190 is added. Therefore, redundant description of the same components is not provided.

As shown in FIG. 10, the base plate 1070 may include a plurality of fixing protrusions 1071 protruding toward the top cover 180. The plurality of fixing protrusions 1071 may be disposed to correspond to the positions of the plurality of fixing holes 112 in the fixing area FA of the back cover 110. That is, the plurality of fixing protrusions 1071 may be disposed to penetrate the plurality of fixing holes 112 in the fixing area FA of the back cover 110, thereby suppressing shaking of the back cover 110 in the final structure.

The plurality of fixing protrusions 1071 may include a structure to which the plurality of fixing members FM can be clamped. The plurality of fixing protrusions 1071 may be formed as, e.g., pem nuts, and may include, e.g., screw threads therein. Thus, the plurality of fixing members FM may be clamped to the plurality of fixing protrusions 1071 with the screw threads inside the fixing protrusions 1071.

The bottom cover 190 may be disposed between the back cover 110 and the top cover 180. A plurality of protrusions 191 may be disposed along one side of the bottom cover 190, and each of the flexible films 130 may be disposed between the plurality of protrusions 191. The plurality of protrusions 191 may each include a through-hole 193. Thus, when the plurality of fixing protrusions 1071 of the base plate 1070 penetrates the plurality of through-holes 193 of the plurality of protrusions 191, the bottom cover 190 may be fixed to the base plate 1070.

On the other side of the bottom cover 190 opposite to the side where the plurality of protrusions 191 is disposed, guide units 192 may protrude from a top surface of the bottom cover 190. The guide units 192 may be spaced apart from each other along an edge of the bottom cover 190 and fix the printed circuit boards 140 disposed on the bottom cover 190 so as not to separate from the bottom cover 190.

The plurality of fixing members FM may be clamped to the plurality of fixing protrusions 1071 so as to fix the base plate 1070, the back cover 110, the bottom cover 190, and the top cover 180 together. Specifically, the plurality of fixing members FM may be disposed to penetrate the plurality of coupling holes 181 in the top cover 180. The plurality of fixing members FM penetrating the plurality of coupling holes 181 in the top cover 180 may be clamped to the plurality of fixing protrusions 1071 of the base plate 1070. Thus, the base plate 1070, the bottom cover 190, the top cover 180, and the back cover 110 can be clamped and fixed together. The plurality of fixing members FM clamping the base plate 1070 and the top cover 180 may be, e.g., screws, bolts, or other similar fastening members, but is not limited thereto.

Hereafter, a process of clamping of the display device according to another example embodiment of the present disclosure will be described in more detail with reference to FIGS. 11A through 11H and FIG. 12.

<Clamping of a Display Device>

Figure 11A:
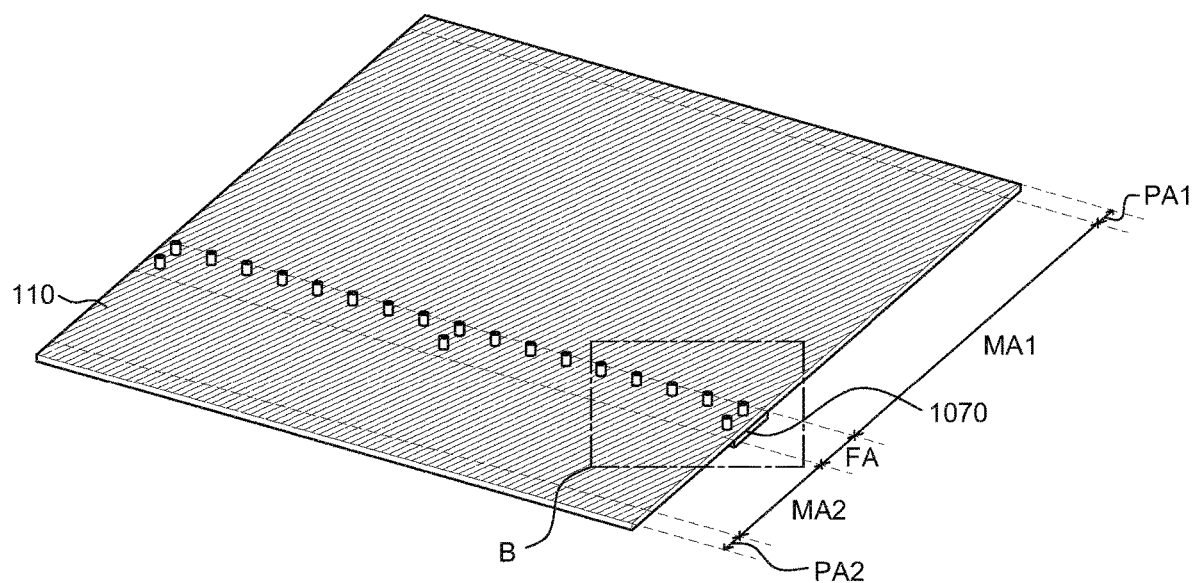
FIGS. 11A through 11H are perspective views provided to explain a process of clamping the display device according to another example embodiment of the present disclosure.
Figure 11B:
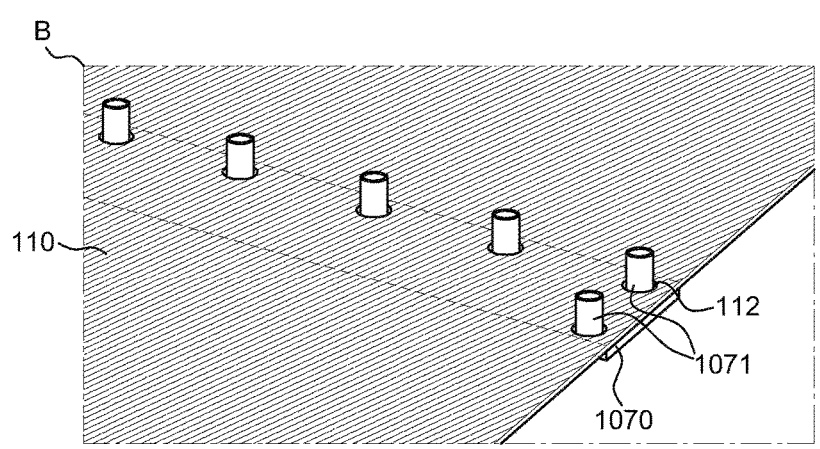
Figure 11C:
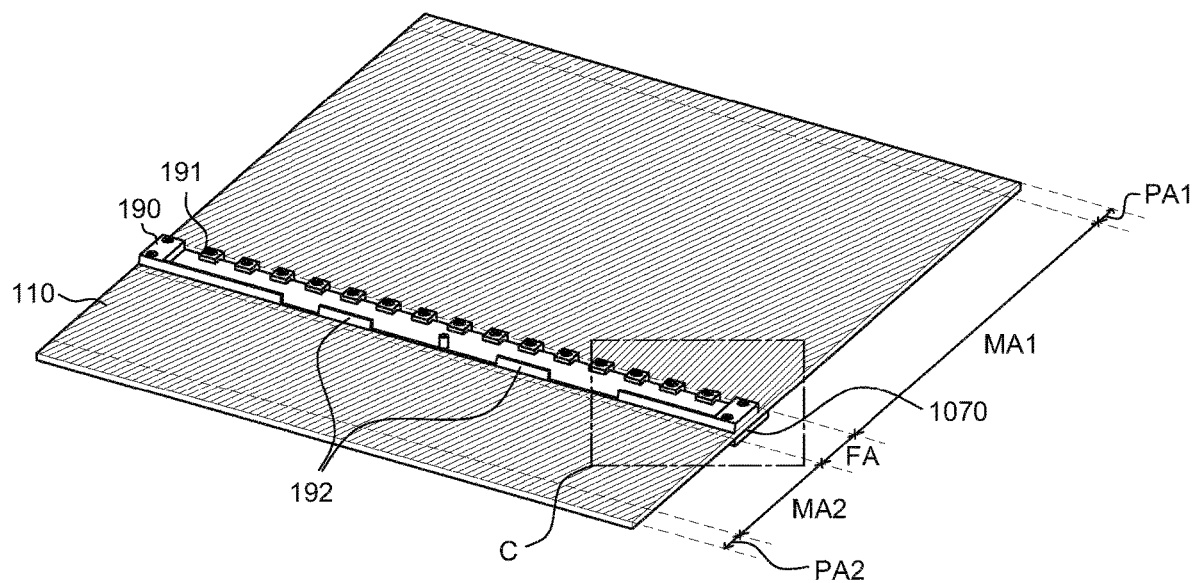
Figure 11D:
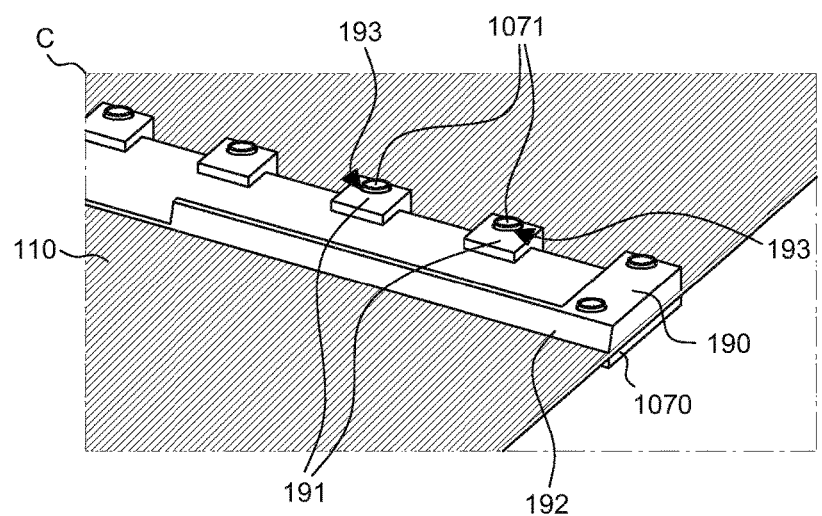
Figure 11E:
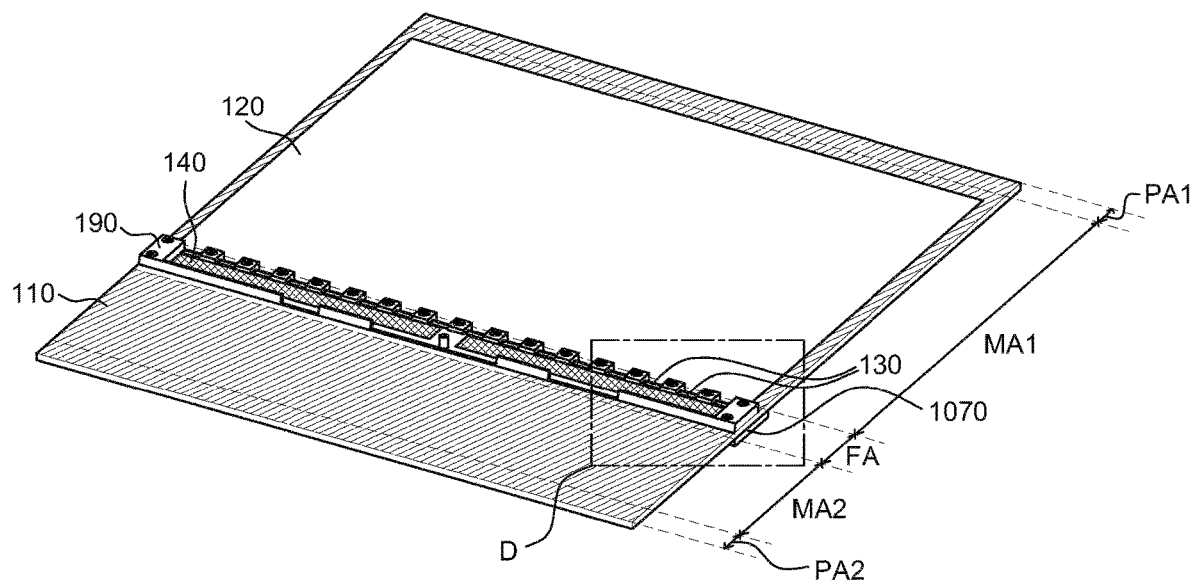
Figure 11F:
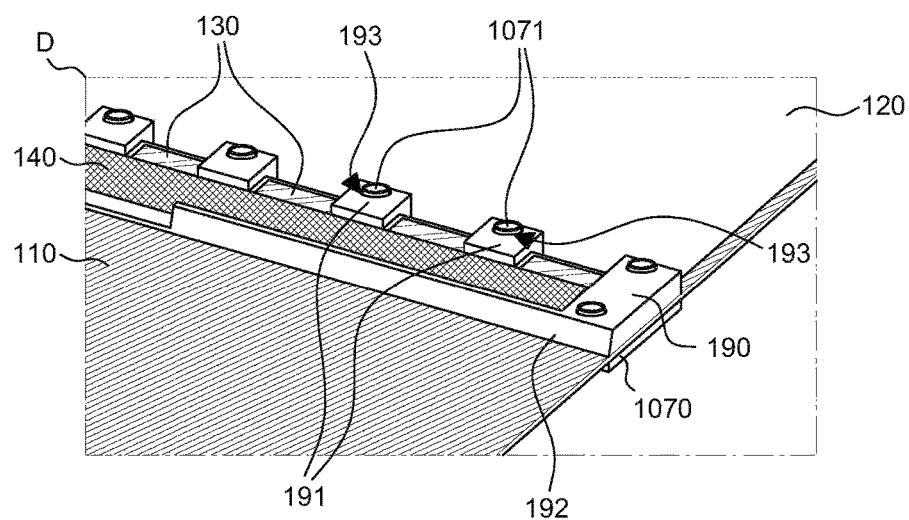
Figure 11G:
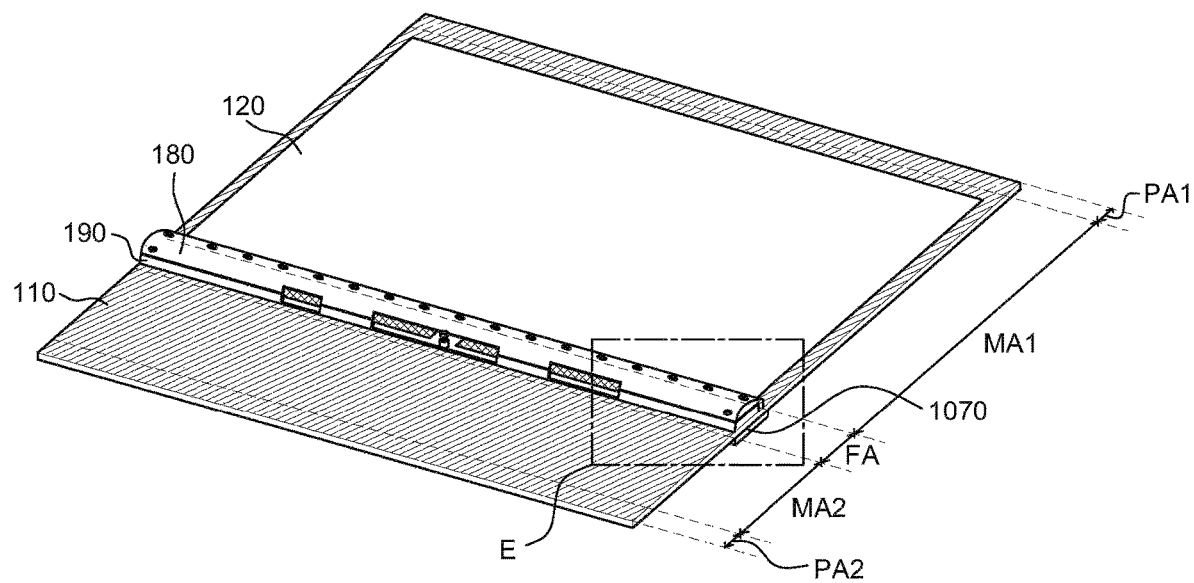
Figure 11H:
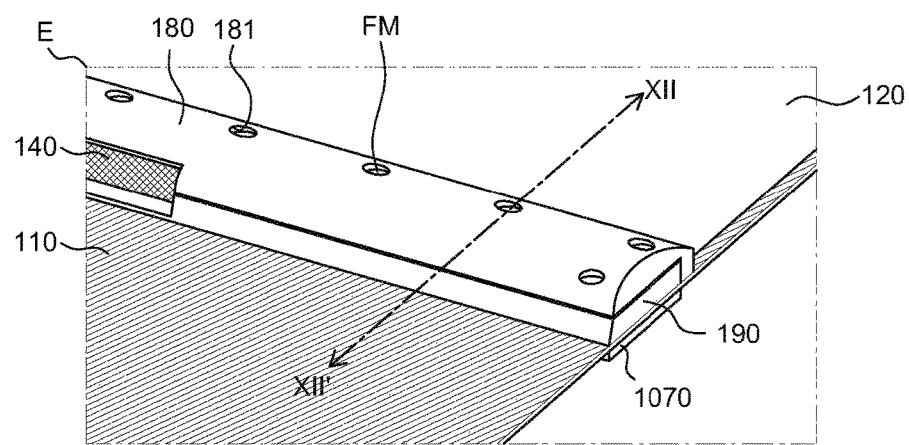
Figure 12:
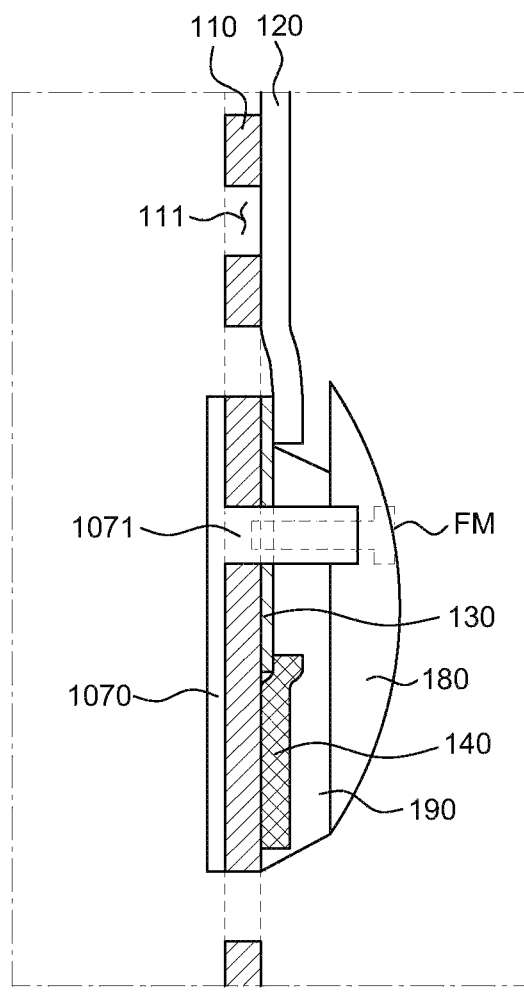
FIG. 12 is a cross-sectional view as taken along a line XII-XII' of FIG. 11H.

FIGS. 11A through 11H are perspective views provided to explain a process of clamping the display device according to another example embodiment of the present disclosure. FIG. 12 is a cross-sectional view as taken along a line XII-XII' of FIG. 11H. Specifically, FIG. 11A is a perspective view illustrating that a base plate 1070 and a back cover 110 of the display device according to another example embodiment of the present disclosure may be coupled to each other. FIG. 11B is an enlarged view of a region "B" of FIG. 11A. FIG. 11C is a perspective view illustrating that a bottom cover 1070 may be disposed on the back cover 110 of the display device according to another example embodiment of the present disclosure. FIG. 11D is an enlarged view of a region "C" of FIG. 11C. FIG. 11E is a perspective view illustrating that flexible films 130, printed circuit boards 140, and a display panel 120 may be disposed on the back cover 110 of the display device according to another example embodiment of the present disclosure. FIG. 11F is an enlarged view of a region "D" of FIG. 11E. FIG. 11G is a perspective view illustrating that a top cover 180 may be coupled to the back cover 110 of the display device according to another example embodiment of the present disclosure. FIG. 11H is an enlarged view of a region "E" of FIG. 11G.

First, as shown in FIG. 11A and FIG. 11B, the back cover 110 and the base plate 1070 may be coupled to each other. Specifically, the base plate 1070 may be disposed on the rear surface of the fixing area FA of the back cover 110, and the plurality of fixing protrusions 1071 of the base plate 1070 may penetrate the plurality of fixing holes 112 in the fixing area FA of the back cover 110. Thus, the back cover 110 may be coupled to the base plate 1070. The plurality of fixing protrusions 1071 of the base plate 1070 may protrude out of the back cover 110. In this case, the number of fixing protrusions 1071 and the number of fixing holes 112 may be determined by the number of flexible films 130. That is, each of the flexible films 130 may be disposed between the fixing protrusions 1071 located at an upper end of the fixing area FA among the plurality of fixing protrusions 1071. Thus, the number of fixing protrusions 1071 located at the upper end of the fixing area FA may be larger than the number of flexible films 130.

Then, as illustrated in FIG. 11C and FIG. 11D, the bottom cover 190 may be disposed on the back cover 110 coupled to the base plate 1070. Specifically, the plurality of fixing protrusions 1071 of the base plate 1070 protruding out of the back cover 110 may be coupled to the plurality of through-holes 193 of the protrusions 191 on the bottom cover 190. Thus, the bottom cover 190 can be fixed by the plurality of fixing protrusions 1071 of the base plate 1070. That is, the plurality of fixing protrusions 1071 may be inserted into the plurality of corresponding through-holes 193 of the protrusions 191 on the bottom cover 190. Thus, the base plate 1070 and the bottom cover 190 can be fixed to each other.

Then, as shown in FIG. 11E and FIG. 11F, the display panel 120 may be disposed on the back cover 110, and the flexible films 130 and the printed circuit boards 140 may be disposed on the bottom cover 190 which is disposed on the back cover 110. Each of the flexible films 130 may be disposed between the protrusions 191 of the bottom cover 190. Thus, it is possible to suppress or minimize shaking of the flexible films 130 and the printed circuit boards 140 during winding or unwinding of the display device 1000. Further, the flexible films 130 and the printed circuit boards 140 may be disposed between the protrusions 191 and the guide units of the bottom cover 190. Thus, it is possible to suppress or prevent the flexible films 130 and the printed circuit boards 140 from separating or breaking away from the bottom cover 190 during winding or unwinding of the display device 1000.

Then, as illustrated in FIG. 11G and FIG. 11H, the top cover 180 may be disposed and fixed on the bottom cover 190, on which the display panel 120, the flexible films 130, and the printed circuit boards 140 may be disposed. Specifically, the plurality of fixing protrusions 1071 of the base plate 1070 may penetrate the plurality of fixing holes 112 in the fixing area FA of the back cover 110 and the plurality of through-holes 193 of the protrusions 191 on the bottom cover 190. Thus, the back cover 110 and the bottom cover 190 may be fixed and covered by the top cover 180, and the top cover 180 may be clamped to the base plate 1070. In this case, the plurality of fixing members FM may be inserted through the plurality of coupling holes 181 in the top cover 180 and coupled to the plurality of fixing protrusions 1071 of the base plate 1070. Thus, the top cover 180, the back cover 110, the bottom cover 190, and the base plate 1070 can be fixed to one another. Also, the display panel 120, the flexible films 130, and the printed circuit boards 140 between the bottom cover 190 and the top cover 180 may be securely fixed together.

FIG. 12 illustrates further details about the clamp structure of the display device according to an example embodiment. The display device 1000 according to the present embodiment may employ a unidirectional clamping method instead of a bidirectional clamping method. Specifically, in the display device 1000 according to another example embodiment of the present disclosure, the plurality of fixing protrusions 1071 may be disposed on the base plate 1070. The plurality of fixing protrusions 1071 of the base plate 1070 may penetrate the plurality of fixing holes 112 in the fixing area FA of the back cover 110 and the plurality of through-holes 193 of the bottom cover 190. The fixing members FM may be inserted into the top cover 180, and, the plurality of fixing protrusions 1071 may be clamped to the fixing members FM by the unidirectional clamping method. Accordingly, the display device 1000 according to another example embodiment of the present disclosure may employ the unidirectional clamping method instead of the bidirectional clamping method. Therefore, it is possible to fix the base plate 1070, the back cover 110, the bottom cover 190, and the top cover 180 more easily using the plurality of fixing members FM. Also, the top cover 180 may be more securely clamped to the rear surface of the back cover 110 using the base plate 1070. Thus, it is possible to suppress or prevent separation of the display panel 120 from the back cover 110 during winding or unwinding of the display device 1000.

<Pad—Secure Fixing of a Display Device>

Figure 13:
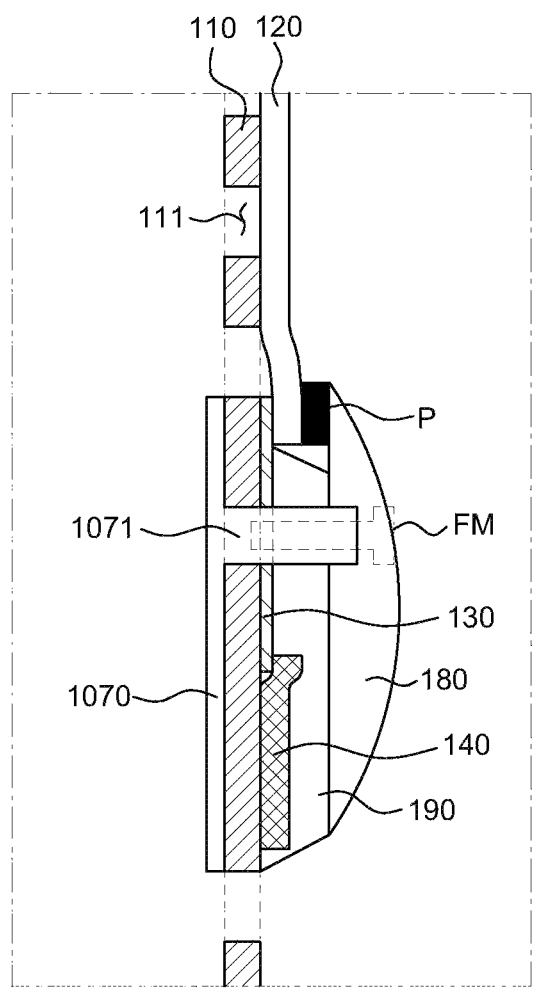
FIG. 13 is a cross-sectional view of a display device according to yet another example embodiment of the present disclosure.

FIG. 13 is a cross-sectional view of a display device according to yet another example embodiment of the present disclosure. A display device illustrated in FIG. 13 has substantially the same configuration as the display device 1000 illustrated in FIGS. 10 through 12 except the addition of a pad P. Therefore, redundant description of the same components is not provided.

As shown in FIG. 13, the pad P may be disposed on a part of a surface (e.g., the front surface) of the display panel 120 between the base plate 1070 and the top cover 180. That is, the pad P may extend in the same direction as an extension direction of the fixing area FA between the display panel 120 and the top cover 180. Herein, the pad P may be formed as a single pad P or including a plurality of pads P.

The pad P may be formed of a material suitable to absorb pressure generated during clamping of the base plate 1070 and the top cover 180, thereby protecting the display panel 120 against the pressure, and may securely fix the display panel 120. Therefore, the pad P may be formed of an insulating material having higher flexibility than the top cover 180 and may be formed of, for example, resin such as silicon, or the like.

In the display device according to yet another example embodiment of the present disclosure, the display panel 120 may be more securely and more safely fixed using the pad P. In a state where the top cover 180 and the base plate 1070 are fixed to each other, if the top cover 180 is spaced apart from the display panel 120, the display panel 120 may not be securely fixed. Thus, during winding or unwinding of the display device 1300, the display panel 120 may be separated from the back cover 110. Also, if an impact or pressure caused by the top cover 180 having rigidity is applied directly to the display panel 120, the display panel 120 may be damaged. Accordingly, in the display device according to yet another example embodiment of the present disclosure, the pad P may be employed to absorb the impact or pressure caused by the top cover 180 and protect the display panel 120 from potential damages. Also, the pad P may fill a space between the top cover 180 and the display panel 120, thereby more securely fixing the display panel 120. Further, with the pad P, it is possible to suppress or prevent separation of the display panel 120 from the back cover 110 more effectively when the display device 1300 is rolled up.

<Coupling of a Back Cover>

Figure 14:
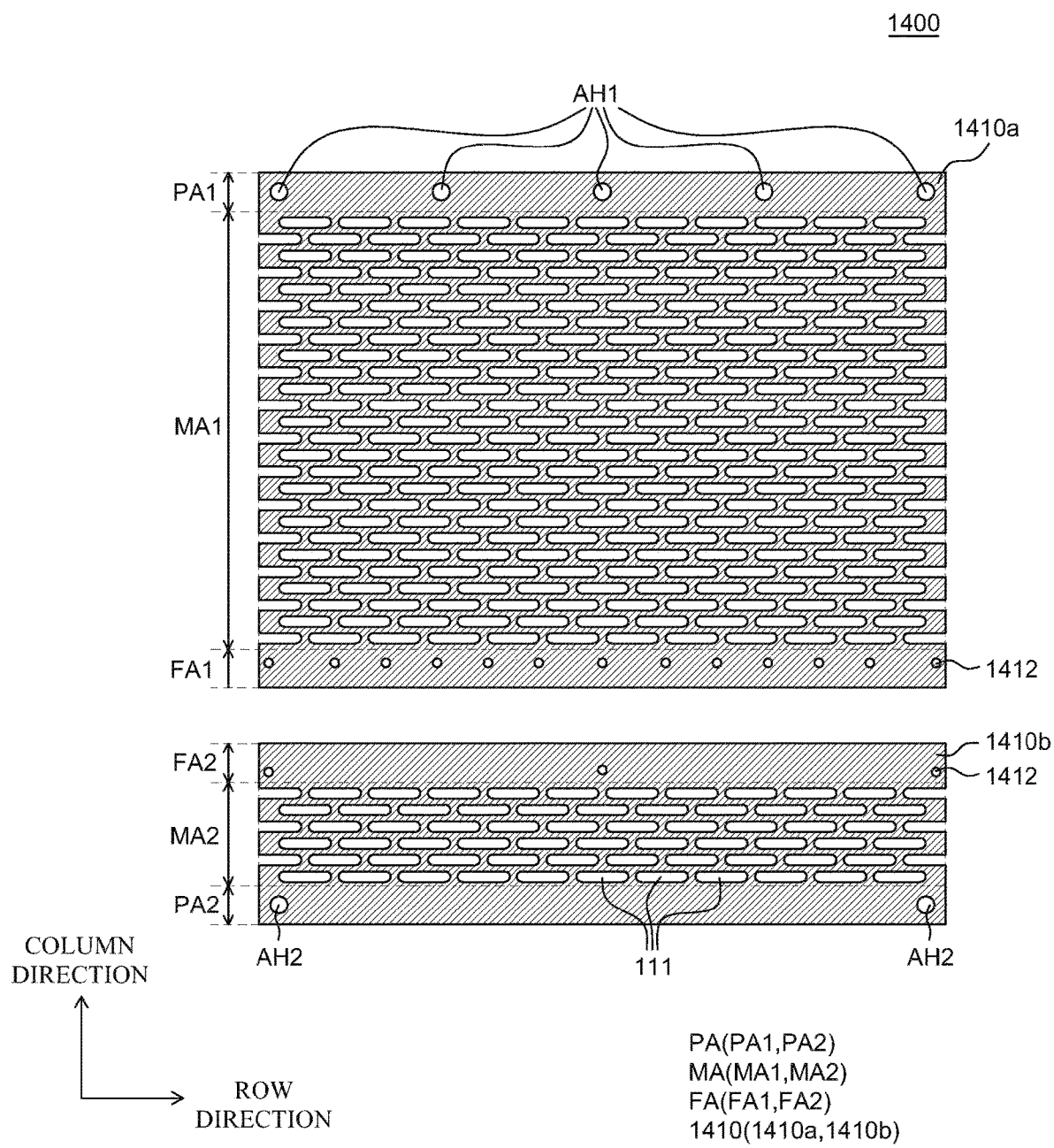
FIG. 14 is a plan view of a back cover of a display device according to still another example embodiment of the present disclosure.
Figure 15A:
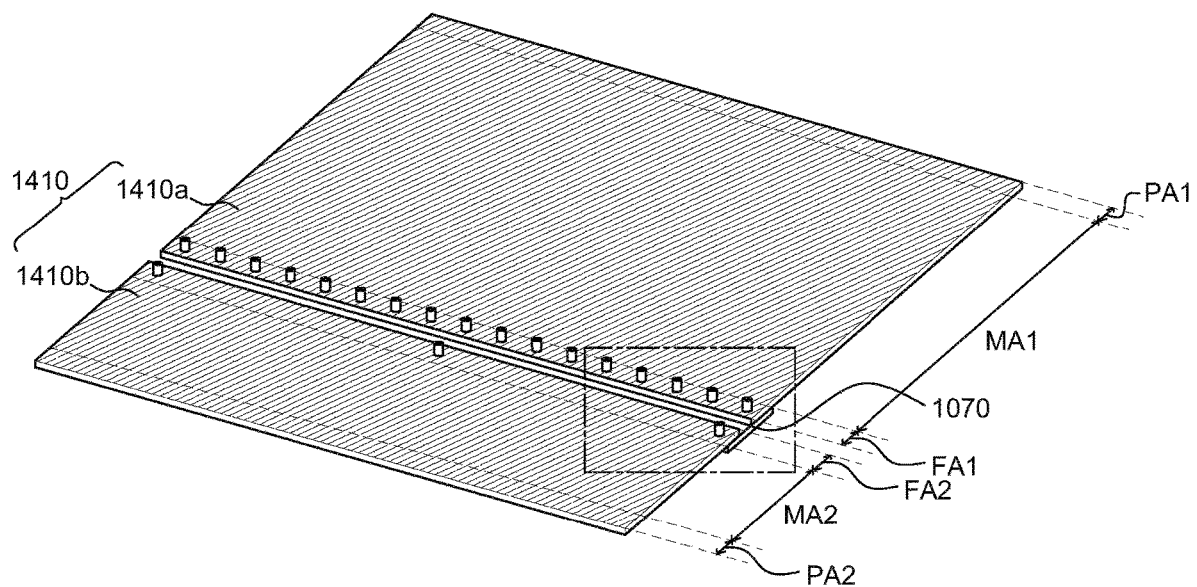
FIG. 15A and FIG. 15B are perspective views provided to explain a process of clamping the display device according to still another example embodiment of the present disclosure.
Figure 15B:
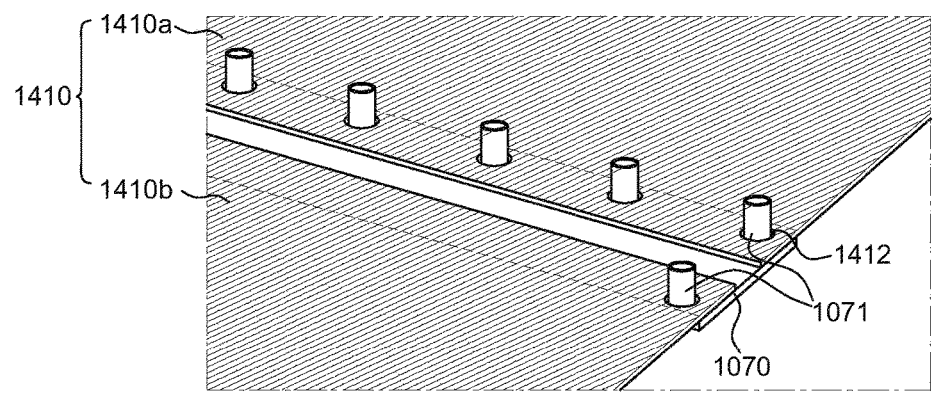
Figure 16:
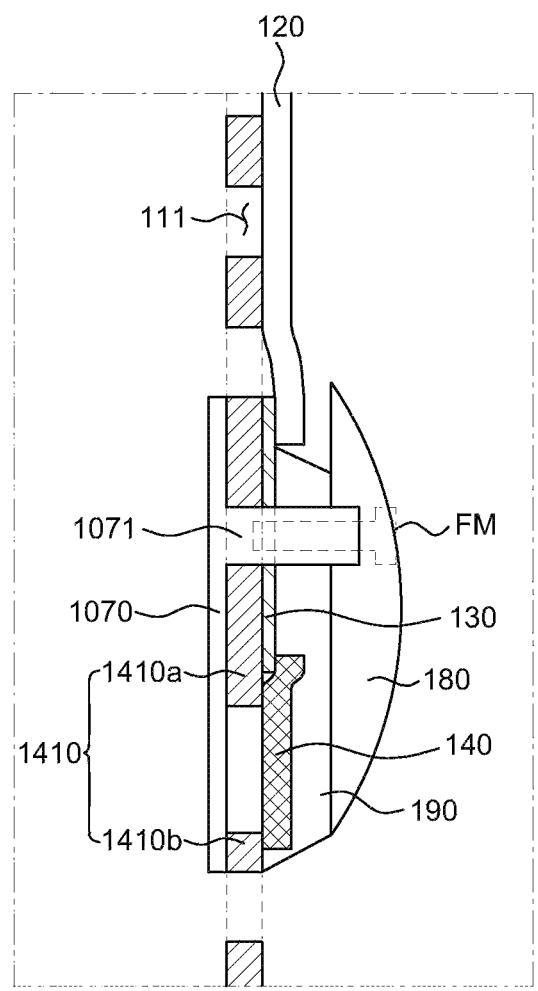
FIG. 16 is a cross-sectional view of the display device according to still another example embodiment of the present disclosure.

FIG. 14 is a plan view of a back cover of a display device according to still another example embodiment of the present disclosure. FIG. 15A and FIG. 15B are perspective views provided to explain a process of clamping the display device according to still another example embodiment of the present disclosure. FIG. 16 is a cross-sectional view of the display device according to still another example embodiment of the present disclosure. A display device 1400 illustrated in FIGS. 14 through 16 has substantially the same configuration as the display device 100 illustrated in FIGS. 1 through 9C, except the shape of a back cover 1410. Therefore, redundant description of the same components is not provided. FIG. 14 illustrates only the back cover 1410 among various components of the display device 1400 for convenience of description.

As shown in FIG. 14, the back cover 1410 may be configured to include a first back cover 1410a and a second back cover 1410b. Specifically, the back cover 1410 may be divided into the first back cover 1410a and the second back cover 1410b at the boundary between a plurality of fixing holes 1412 in a first fixing area FA1 and a plurality of fixing holes 1412 in a second fixing area FA2. That is, the first back cover 1410a may include the first supporting area PA1, the first flexible area MA1, and the first fixing area FA1. Also, the second back cover 1410b may include the second fixing area FA2, the second flexible area MA2, and the second supporting area PA2. Thus, the first back cover 1410a may be fixed to the head bar 164 and the second back cover 1410b may be fixed to the roller 151.

As illustrated in FIG. 15A and FIG. 15B, the first fixing area FA1 of the first back cover 1410a and the second fixing area FA2 of the second back cover 1410b may be coupled to each other by the plurality of fixing protrusions 1071 of the base plate 1070. That is, the plurality of fixing protrusions 1071 disposed on the upper side of the base plate 1070 may be inserted into the plurality of fixing holes 1412 disposed in the first fixing area FA1 of the first back cover 1410a. Also, the plurality of fixing protrusions 1071 disposed in the lower side of the base plate 1070 may be inserted into the plurality of fixing holes 1412 disposed in the second fixing area FA2 of the second back cover 1410b. Thus, the first back cover 1410a and the second back cover 1410b can be coupled to each other by the base plate 1070.

Then, as shown in FIG. 16, the bottom cover 190, the display panel 120, the flexible films 130, the printed circuit boards 140, and the top cover 180 may be disposed. Then, the plurality of fixing members FM and the plurality of fixing protrusions 1071 may be clamped to fix the first back cover 1410a and the second back cover 1410b securely.

In the display device 1400 according to still another example embodiment of the present disclosure, the back cover 1410 may include the first back cover 1410a and the second back cover 1410b spaced apart from each other. Thus, the back cover 1410 may be formed to support various sizes of the display panel 120. As the size of the display device 1400 increases, the size of the display panel 120 may also increase. In this case, the back cover 1410 may need to be larger in size than the display panel 120. Therefore, a single back cover 1410 may need to be manufactured to a large size. However, depending on the size of the display device, it may be difficult to manufacture the single back cover 1410 that can support a large-size display device. Accordingly, in the display device 1400 according to still another example embodiment of the present disclosure, the back cover 1410 may be configured to include the first back cover 1410a and the second back cover 1410b. Thus, the first back cover 1410a and the second back cover 1410b which are smaller in size than the display device 1400 may be used. Also, the first back cover 1410a and the second back cover 1410b may be fixed together by the base plate 1070, the bottom cover 190, the back cover 1410, the top cover 180, and the fixing members FM. Therefore, the first back cover 1410a and the second back cover 1410b can function similarly as a single back cover 1410. Also, the back cover 1410 may be manufactured in smaller sizes, and the productivity may therefore be improved.

In this case, the second back cover 1410b may have a smaller thickness than the first back cover 1410a. Since the second back cover 1410b may be fixed directly to the roller 151, the second back cover 1410b may be wound around the roller 151 prior to the first back cover 1410a being wound. Thus, the second back cover 1410b may be wound with a smaller radius of curvature and may be applied with more stress than the first back cover 1410a. Therefore, in the display device 1400 according to still another example embodiment of the present disclosure, the thickness of the second back cover 1410b may be set smaller than the thickness of the first back cover 1410a. Thus, it is possible to improve the flexibility of the second back cover 1410b and suppress potential damages to the second back cover 1410b during winding or unwinding of the display device 1400.

<Disposition of a Flexible Film>

Figure 17:
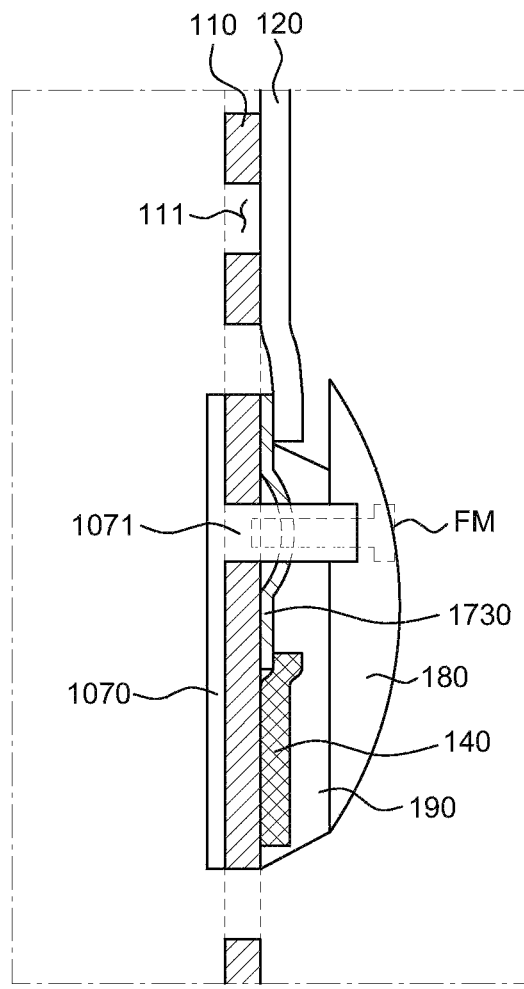
FIG. 17 is a cross-sectional view of a display device according to still another example embodiment of the present disclosure.

FIG. 17 is a cross-sectional view of a display device according to still another example embodiment of the present disclosure. A display device 1700 illustrated in FIG. 17 has substantially the same configuration as the display device 1000 illustrated in FIG. 10, except the disposition of a flexible film 1730. Therefore, redundant description of the same components is not provided.

As shown in FIG. 17, the flexible film 1730 may protrude in a convex shape toward the top cover 180. That is, the flexible film 1730 may be partially bent and be connected to the printed circuit board 140 and the display panel 120. Even if the flexible film 1730 is partially bent, it can be stably housed in the top cover 180 and securely fixed.

In the display device 1700 according to still another example embodiment of the present disclosure, the flexible film 1730 may protrude in a convex shape toward the top cover 180. Thus, it is possible to minimize stress applied to the flexible film 1730 when the display device 1700 is rolled up, thereby minimizing or suppressing damage to the flexible film 1730. Specifically, during winding of the display device 1700, the flexible film 1730 of the display device 1700 may be folded in a "C" shape, unlike the example illustrated in FIG. 17. In this case, the flexible film 1730 may be securely fixed by the base plate 1070, the top cover 180, and the bottom cover 190, but may be applied with stress during winding. Therefore, in the display device 1700 according to still another example embodiment of the present disclosure, the flexible film 1730 may protrude in a convex shape toward the top cover 180 and thus have a margin for deformation during winding. Therefore, it is possible to suppress or minimize potential damages to the flexible film 1730.

Various example embodiments of the present disclosure may also be described as follows:

In an aspect of the present disclosure, a display device may comprise: a display panel including a plurality of sub-pixels; a back cover configured to support the display panel and configured be wound or unwound along with the display panel; a base plate on a first surface of the back cover to support the back cover; and a top cover on a second surface of the back cover opposite the first surface so that the back cover is between the base plate and the top cover. The top cover may be fixed to the back cover. The top cover may have a curved outer peripheral surface.

The display device may further comprise a plurality of fixing members penetrating a plurality of fixing holes in the back cover to fix the base plate and the top cover to each other.

The plurality of fixing members may include a plurality of first fixing members penetrating a plurality of coupling holes in the base plate, and a plurality of second fixing members penetrating a plurality of coupling holes in the top cover and coupled to the plurality of first fixing members.

The display device may further comprise a bottom cover between the back cover and the top cover.

The base plate may include a plurality of fixing protrusions protruding toward the top cover. The plurality of fixing protrusions may penetrate the bottom cover. The plurality of fixing protrusions may be coupled to the top cover to fix the base plate to the top cover.

The display device may further comprise: a plurality of flexible films between the bottom cover and the top cover, and connected to the display panel; and a printed circuit board between the bottom cover and the top cover, and connected to the plurality of flexible films. The bottom cover may include a plurality of protrusions for holding the plurality of flexible films in place and a guide unit for holding the printed circuit board in place.

At least one of the plurality of flexible films may protrude in a convex shape toward the top cover.

The display device may further comprise a plurality of fixing members penetrating a plurality of coupling holes in the top cover and coupled to the plurality of fixing protrusions.

The display device may further comprise a pad between the top cover and the display panel to hold the display panel in place.

The back cover may include a first back cover and a second back cover. The first back cover and the second back cover may be fixed to each other by the base plate and the top cover.

The display device may further comprise a roller fixed to the second back cover and a head bar fixed to the first back cover. The second back cover may have a smaller thickness than the first back cover.

The back cover may include: a fixing area between the base plate and the top cover; a first flexible area extending from an upper side of the fixing area and including a plurality of openings; a first supporting area extending from the first flexible area away from the fixing area, the first flexible area being between the first supporting area and the fixing area; a second flexible area extending from a lower side of the fixing area; and a second supporting area extending from the second flexible area away from the fixing area, the second flexible area being between the second supporting area and the fixing area.

The display device may further comprise a roller fixed to the second supporting area and configured to wind or unwind the back cover and the display. The roller may include a flat part and a curved part. The fixing area of the back cover may be configured to be disposed on the flat part of the roller when the back cover is wound around the roller.

In another aspect of the present disclosure, a display device may comprise: a display panel configured to display an image; a back cover disposed under the display panel and including a fixing area in which a plurality of fixing holes is disposed; a printed circuit board connected electrically to the display panel and disposed on the fixing area of the back cover; a base plate under the fixing area of the back cover; and a top cover on the printed circuit board on the fixing area of the back cover. The base plate and the top cover may be coupled to the back cover via the plurality of fixing holes.

The display device may further comprise a plurality of fixing members penetrating a plurality of coupling holes in the base plate, the plurality of fixing holes, and a plurality of coupling holes in the top cover to fix the base plate, the back cover, and the top cover with one another.

The display device may further comprise: a plurality of fixing members penetrating a plurality of coupling holes in the top cover and the plurality of fixing holes; and a plurality of fixing protrusions in the base plate. The plurality of fixing members and the plurality of fixing protrusions may fix the base plate, the back cover, and the top cover with one another.

The display device may further comprise a bottom cover between the back cover and the top cover. The bottom cover may include a plurality of through-holes through which the plurality of fixing protrusions penetrates.

The display device may further comprise a plurality of flexible films electrically connecting the display panel and the printed circuit board. The plurality of flexible films, the printed circuit board, and the display panel may be held in place by the base plate and the top cover.

The display device may further comprise a pad between the display panel and the top cover to hold the display panel in place.

The display device may further comprise a roller coupled to the back cover and configured to wind or unwind the back cover and the display panel.

Although the example embodiments of the present disclosure are described above in detail with reference to the accompanying drawings, the present disclosure is not limited thereto and may be embodied in many different forms without departing from the technical concept of the present disclosure. Therefore, the example embodiments of the present disclosure are provided for illustrative purposes only and are not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following appended claims, and all the technical concepts in the equivalent scope thereof should be construed as falling within the scope of the present disclosure.

It will be apparent to those skilled in the art that various modifications and variations can be made in the display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
a display panel in which a plurality of sub-pixels is defined;
a roller configured to wind or unwind the display panel;
a first cover configured to support the display panel and configured be wound or unwound along with the display panel;
a second cover fixed to the roller;
a base plate disposed on one surface of the first cover and the second cover; and
a top cover disposed on another surface of the first cover and the second cover,
wherein the first cover and the second cover are coupled to each other by the base plate.

2. The display device according to claim 1, wherein the first cover includes a plurality of openings.

3. The display device according to claim 1, wherein the first cover and the second cover are interposed between the base plate and the top cover.

4. The display device according to claim 1, wherein the top cover has a curved outer peripheral surface.

5. The display device according to claim 1, further comprising:
a plurality of fixing members penetrating a plurality of holes in the first cover and the second cover to fix the base plate and the top cover to each other.

6. The display device according to claim 5, wherein the base plate includes a plurality of fixing protrusions protruding toward the top cover, and
wherein the plurality of fixing members are clamped with the plurality of fixing protrusions to couple the first cover and the second cover together.

7. The display device according to claim 6, further comprising a bottom cover between the first cover and the top cover,
wherein the first cover and the second cover are coupled together by the base plate, the bottom cover, the top cover, and the plurality of fixing members.

8. The display device according to claim 7, further comprising a plurality of flexible films between the bottom cover and the top cover, and connected to the display panel,
wherein at least one of the plurality of flexible films protrudes in a convex shape.

9. The display device according to claim 1, further comprising a head bar fixed to the first cover.

10. The display device according to claim 1, wherein the second cover has a smaller thickness than the first cover.

11. The display device according to claim 1, wherein the second cover is smaller in size than the display panel.

12. The display device according to claim 1, further comprising a bottom cover between the base plate and the top cover.

13. The display device according to claim 12, wherein the base plate includes a plurality of fixing protrusions protruding toward the top cover,
wherein the plurality of fixing protrusions penetrates the bottom cover, and
wherein the base plate is fixed to the top cover by coupling of the top cover and the plurality of fixing protrusions.

14. The display device according to claim 12, further comprising:
a plurality of flexible films between the bottom cover and the top cover, and connected to the display panel; and
a printed circuit board between the bottom cover and the top cover, and connected to the plurality of flexible films.

15. The display device according to claim 14, wherein the bottom cover includes a plurality of protrusions for holding the plurality of flexible films.

16. The display device according to claim 15, wherein the plurality of protrusions includes a plurality of through-holes, and
wherein the plurality of fixing protrusions of the base plate penetrates the plurality of through-holes of the plurality of protrusions to fix the bottom cover to the base plate.

17. The display device according to claim 14, wherein the bottom cover includes a guide unit for holding the printed circuit board.

* * * * *